United States Patent
Katta

(10) Patent No.: US 8,259,431 B2
(45) Date of Patent: Sep. 4, 2012

(54) VARIABLE CAPACITOR ARRAY, VARIABLE CAPACITOR ARRAY DEVICE AND CIRCUIT MODULE

(75) Inventor: Hiroshi Katta, Kyoto (JP)

(73) Assignee: Kyocera Corporation, Kyoto (JP)

( * ) Notice: Subject to any disclaimer, the term of this patent is extended or adjusted under 35 U.S.C. 154(b) by 809 days.

(21) Appl. No.: 12/306,902

(22) PCT Filed: Jun. 29, 2007

(86) PCT No.: PCT/JP2007/063178
§ 371 (c)(1),
(2), (4) Date: Dec. 29, 2008

(87) PCT Pub. No.: WO2008/001914
PCT Pub. Date: Jan. 3, 2008

(65) Prior Publication Data
US 2009/0310275 A1    Dec. 17, 2009

(30) Foreign Application Priority Data

Jun. 29, 2006 (JP) .................. 2006-179384
Jul. 5, 2006 (JP) .................. 2006-185996

(51) Int. Cl.
*H01G 5/00* (2006.01)
*H01G 7/00* (2006.01)
(52) U.S. Cl. ........................ 361/277; 361/329
(58) Field of Classification Search ............ 361/277, 361/328–329, 311, 280–281
See application file for complete search history.

(56) References Cited

U.S. PATENT DOCUMENTS 5,472,935 A    12/1995  Yandrofski et al.
7,002,435 B2    2/2006  Mishima et al.
7,078,980 B2    7/2006  Muramatsu
(Continued)

FOREIGN PATENT DOCUMENTS
JP           59022449 A    2/1984
(Continued)

OTHER PUBLICATIONS

Japanese language office action dated Dec. 7, 2010 and its English language translation for corresponding Japanese application 2008522665.

*Primary Examiner* — Eric Thomas
(74) *Attorney, Agent, or Firm* — DLA Piper LLP (US)

(57) ABSTRACT

The invention relates to a variable capacitor array which has excellent controllability on a capacitance value and has variable and high tunability. The variable capacitor array includes a first variable capacitor (C1) having a capacitance which is varied according to application of voltage; a first terminal (O1) connected to one side of the first variable capacitor; a second variable capacitor (C2) having a capacitance which is varied by application of voltage; a second terminal (O2) connected to one side of the second variable capacitor; and a third terminal (I) connected to both of the other side of the first variable capacitor and the other side of the second variable capacitor, wherein a state can be selected by switching between at least two selection states among three selection states of a first selection state that the first terminal (O1) and the third terminal (I) are selected, a second selection state that the second terminal (O2) and the third terminal (I) are selected, and a third selection state that the first selection state and the second selection state are selected simultaneously.

14 Claims, 12 Drawing Sheets

U.S. PATENT DOCUMENTS

| | | |
|---|---|---|
| 7,259,638 B2 | 8/2007 | Takahashi |
| 2004/0150485 A1 | 8/2004 | Muramatsu |
| 2005/0104680 A1* | 5/2005 | Katta ............................... 333/32 |
| 2006/0055481 A1 | 3/2006 | Takahashi |
| 2006/0114074 A1 | 6/2006 | Matsui et al. |
| 2006/0198077 A1* | 9/2006 | Bhutta ........................ 361/277 |

FOREIGN PATENT DOCUMENTS

| | | |
|---|---|---|
| JP | 08509103 T | 9/1996 |
| JP | 11-260667 | 9/1999 |
| JP | 2001-326502 | 11/2001 |
| JP | 2004048589 A | 2/2004 |
| JP | 2004-165588 | 6/2004 |
| JP | 2004229102 A | 8/2004 |
| JP | 2005-184270 | 7/2005 |
| JP | 2006-066178 | 3/2006 |
| JP | 2006066178 A | 3/2006 |
| JP | 2006086740 A | 3/2006 |
| JP | 2006-157767 | 6/2006 |
| WO | 9413028 A1 | 12/1993 |
| WO | 9413028 A1 | 6/1994 |

* cited by examiner

VARIABLE CAPACITOR ARRAY, VARIABLE CAPACITOR ARRAY DEVICE AND CIRCUIT MODULE

CROSS-REFERENCE TO RELATED APPLICATIONS

This application is a national stage of international application No. PCT/JP2007/063178 filed on Jun. 29, 2007, and claims the benefit of priority under 35 USC 119 of Japanese Patent Application No. 2006-179384 filed on Jun. 29, 2006, and Japanese Patent Application No. 2006-185996 filed on Jul. 5, 2006 which are incorporated herein by reference.

TECHNICAL FIELD

The invention relates to a variable capacitor array of a plurality of variable capacitors connected to each other, each of which has a dielectric layer formed in a thin-film forming method, relates to a variable capacitor array device having the same and relates to a circuit module having the same.

BACKGROUND ART

There has been known a variable capacitor which has a structure that a thin-film lower electrode layer, a thin-film dielectric layer, and a thin-film upper electrode layer are deposited in this order on an electrically insulating supporting substrate, in which a dielectric material of barium strontium titanate ($(Ba_xSr_{1-x})_yTi_{1-y}O_{3-z}$) (hereinafter also referred to as BST) is used for a material of the thin-film dielectric layer and a capacitance is changed by variation of dielectric constant induced by application of a predetermined bias potential between the upper electrode layer and the lower electrode layer (for example, refer to Japanese Unexamined Patent Publication JP-A 11-260667 (1999)).

Such capacitance variation of the variable capacitor occurs even in a high-frequency region and it is therefore available even in the high-frequency region. By using capacitance variation of the variable capacitor induced by a direct-current bias voltage in the high-frequency region, it is possible to obtain a useful electronic component which is capable of changing frequency characteristics.

For example, a voltage control type thin-film resonator in which the above-described variable capacitor and a thin-film inductor are incorporated, is capable of changing a resonant frequency by application of a direct-current bias voltage. Further, a voltage control type thin-film band-pass filter in which the variable capacitor or the voltage control type thin-film resonator, a thin-film inductor, and a thin-film capacitor are incorporated, is capable of changing a passband by application of a direct-current bias voltage. Further, the variable capacitor is also available in a voltage control type electronic component for microwaves (Japanese Unexamined Patent Publication JP-A 8-509103 (1996)).

The variable capacitor having the high dielectric constant thin film as described above is required to have high tunability and a high Q value as well as a low temperature coefficient, high power handling capability, high insulation resistance, a small distortion characteristic, no change with time, and the like. Note that the tunability represents a variable amount of the variable capacitor and is expressed in the expression: Tunability $x = (C(0)-C(V)/C(0) \times 100(\%)$ wherein $C(0)$ represents a capacitance before voltage application (initial capacitance) and $C(V)$ represents a capacitance after voltage application.

Further, there has been proposed a configuration that a variable capacitor includes a plurality of variable capacitance elements connected in series, each of which has the same configuration as each other, and a bias line for application of direct-current bias voltage is disposed on each of the variable capacitance elements. This makes it possible that the direct-current voltage is stably and evenly applied to the respective variable capacitance elements as well as that the high frequency voltage (high frequency signals) is divided for the respective variable capacitance elements. As a result, it is possible to provide a variable capacitor that a direct-current bias voltage-induced capacitance change is large while high frequency signal-induced capacitance change, noise, and nonlinear distortion can be reduced as well as that has excellent power handling capability (for example, refer to Japanese Unexamined Patent Publication JP-A 2004-165588).

The inventor has taken note of the high rate of capacitance change, a small distortion characteristic, high power handling capability, and the like, of the variable capacitor shown in JP-A 2004-165588, and in order to use these characteristics in an electronic component constituting a circuit for propagation of high frequency signals, he connected plural lines of the variable capacitors as mentioned above in parallel or in series, thus obtaining a variable capacitor array. In this case, a degree of freedom in selecting the initial capacitance $C(0)$ becomes higher as a whole variable capacitor array, thereby allowing for a variable capacitor array having a desired value of the initial capacitance. For example, the initial capacitance $C(0)$ can be higher in N lines of the variable capacitors connected in parallel. However, in the variable capacitor array having such a configuration, bias lines are provided so as to apply direct-current bias voltage to the respective variable capacitors separately, for example, so that the applied voltage (direct-current bias voltage which may be simply referred to as bias voltage) is equally applied to the respective lines of the variable capacitors connected in parallel, and even in this case, the tunability of the variable capacitor array as a whole is the same as that of the variable capacitor and thus not be able to be higher.

On the other hand, because the tunability is higher with a higher electric field intensity, the variable capacitor having such a thin film with high dielectric constant as being BST-made can meet a high tunability requirement by reducing a thickness of a dielectric thin film. However, the reduction in the film thickness deteriorates power handling capability, a leakage current characteristic, reliability, or the like, and therefore there is a limit to the control on the tunability through the film thickness.

In addition, the tunability depends on a material constituting the high-dielectric constant thin film, and the material is still being studied and no material has been known so far that can be mass-produced and attain tunability which meets demands of the market.

As described above, when plural lines of the variable capacitors having the same tunability are merely connected, there is a problem that the tunability of the variable capacitor array does not change and becomes constant, thus leading to a failure in meeting a still higher tunability requirement. Moreover, in the case where the variable capacitor is used in a mobile phone or the like, power consumption needs to be reduced, and besides, since the applicable direct-current bias voltage is limited, it is desirable to realize high tunability even when a voltage applied is low.

DISCLOSURE OF INVENTION

The invention has been devised in view of the above-mentioned circumstances, and its object is to provide a variable capacitor array of which initial capacitance value can be set at a desired level and which has a high tunability characteristic with variable capacitors connected in parallel.

According to one of the invention, a variable capacitor array includes a first variable capacitor; a second variable capacitor; a first terminal connected to one electrode of the first variable capacitor; a second terminal connected to one electrode of the second variable capacitor; and a third terminal connected to both of another electrode of the first variable capacitor and another electrode of the second variable capacitor, each of the first and the second variable capacitors including: a dielectric layer having dielectric constant which is varied by application of voltage; and a pair of electrodes holding the dielectric layer therebetween, wherein a selection state can be selected by switching between at least two selection states among three selection states of a first selection state that the first terminal and the third terminal are selected, a second selection state that the second terminal and the third terminal are selected, and a third selection state that the first selection state and the second selection state are selected simultaneously.

According to the variable capacitor array of the invention, one selection state can be selected by switching between at least two selection states among the three selection states of the first selection state, the second selection state, and the third selection state, with the result that the capacitance of the whole variable capacitor array can change not only in a range of capacitance that is variable by voltage application in one selection state, but also in a range of capacitance that is variable by voltage application in at least another selection state, therefore allowing for higher tunability of the whole variable capacitor array. The voltage applied to the first and second variable capacitors is hereinafter referred to as direct-current voltage or bias voltage.

Further, according to one of the invention, a variable capacitor array device includes the above-stated variable capacitor array; a switching element for selecting a selection state by switching between at least two selection states selected from the three selection states; and a fourth terminal to which at least one of the first and the second terminals is connected by way of the switching element.

According to the variable capacitor array device of the invention, the switching element is used to allow a state to be selected by switching between at least two selection states among the three selection states of the first selection state, the second selection state, and the third selection state, so that the variable capacitor array device can be provided with high tunability.

According to one of the invention, a circuit module includes as a capacitor the above-stated variable capacitor array device with the third terminal and the fourth terminal serving as input and output terminals.

According to the circuit module of the invention, the above-stated variable capacitor array device is used as a capacitor which constitutes a resonant circuit, a phase shifting circuit, a matching circuit, an attenuation circuit, or the like, thereby allowing for an increase in an applicable frequency range or power range. Further, it is also possible to broaden an applicable temperature range because characteristics even varying depending on a temperature of usage environment can be adjusted by the variable capacitor array device. This allows the circuit module to have broad utility. Furthermore, when the above variable capacitor array device having the above variable capacitor array is used to constitute a circuit module, it is possible to realize the circuit module which has excellent power handling capability with small waveform distortion and intermodulation distortion noise. The circuit module as just described can be used for a resonator or a voltage control type high frequency filter, a voltage control type antenna duplexer, or the like having a resonant circuit.

BRIEF DESCRIPTION OF DRAWINGS

Objects, features, and advantages of the invention will be more explicit from the following detailed description taken with reference to the drawing wherein.

BEST MODE FOR CARRYING OUT THE INVENTION

Figure 1:
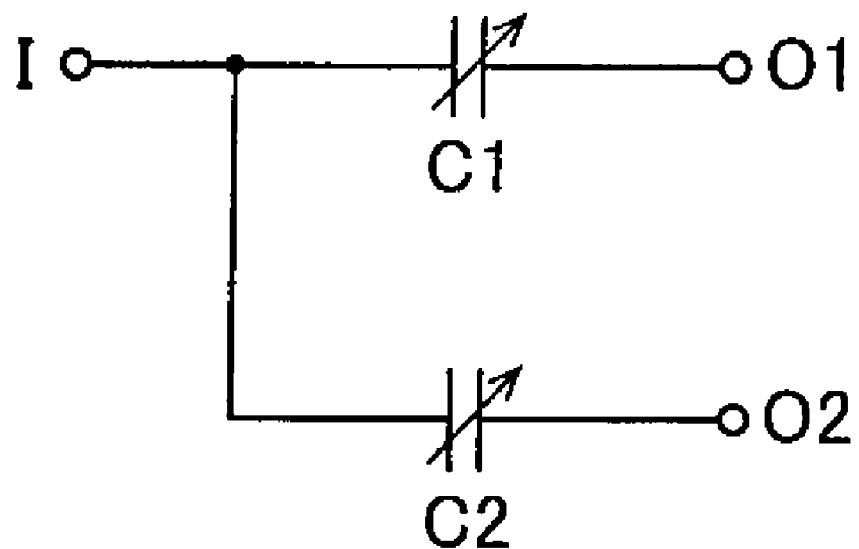
FIG. 1 is an equivalent circuit schematic showing a variable capacitor array according to the first embodiment of the invention.

Now referring to the drawings, preferred embodiments of the invention are described below.

Hereinbelow, a variable capacitor array of the invention is described in detail with reference to the drawings.

Figure 2A:
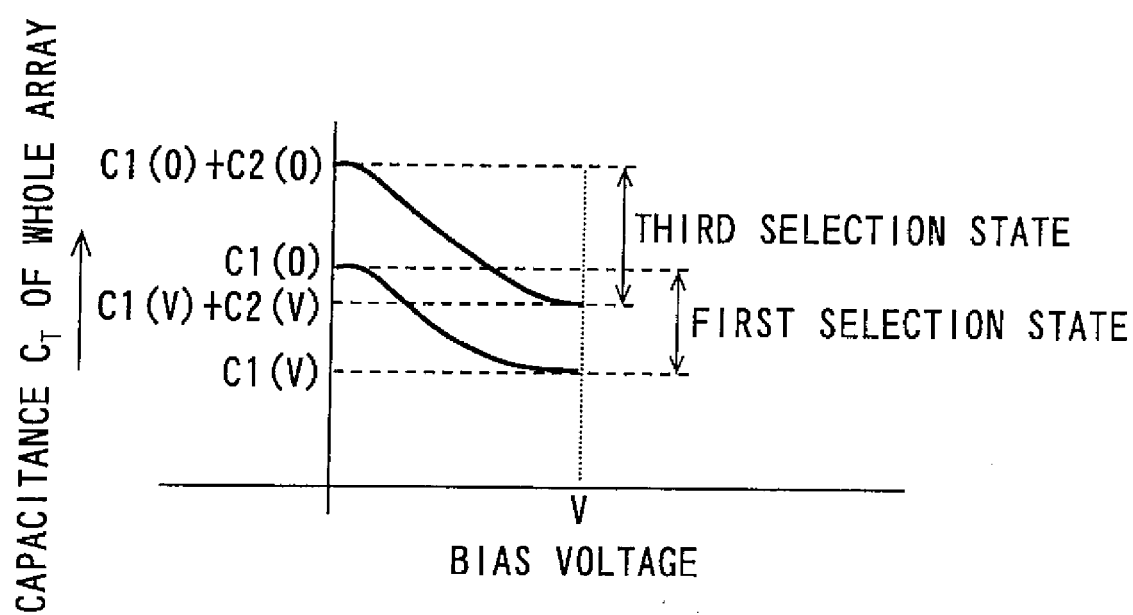
FIGS. 2A to 2C are diagrammatic views each showing a relationship between a capacitance $C_T$ of a whole variable capacitor array and a bias voltage with at least two selection states switched among the first selection state, the second selection state, and the third selection state, of the variable capacitor array shown in FIG. 1.
Figure 2B:
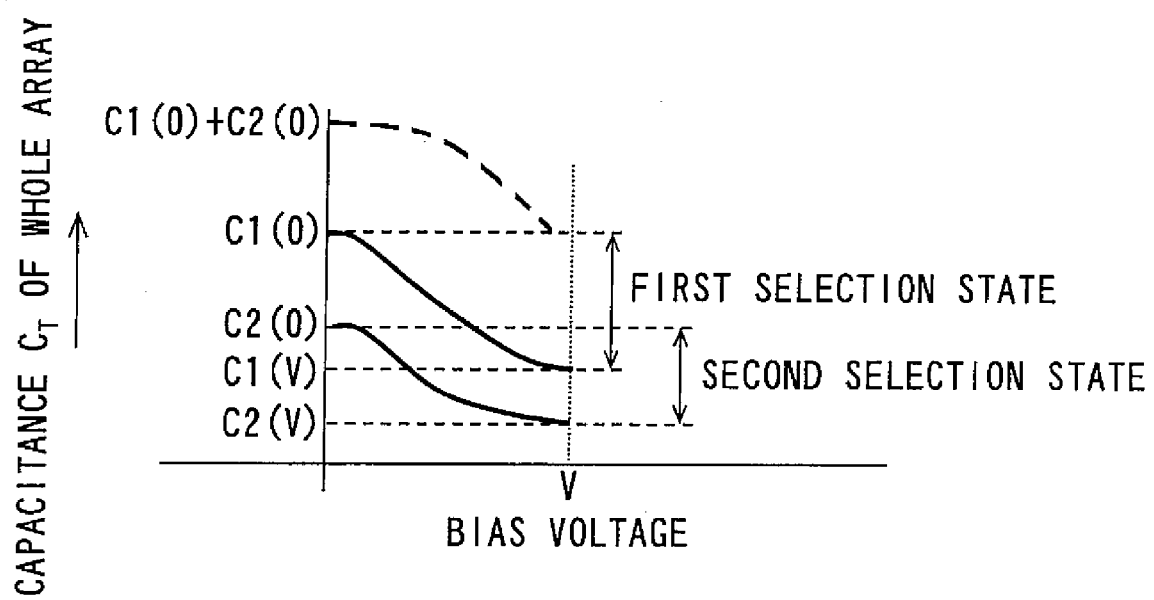
Figure 2C:
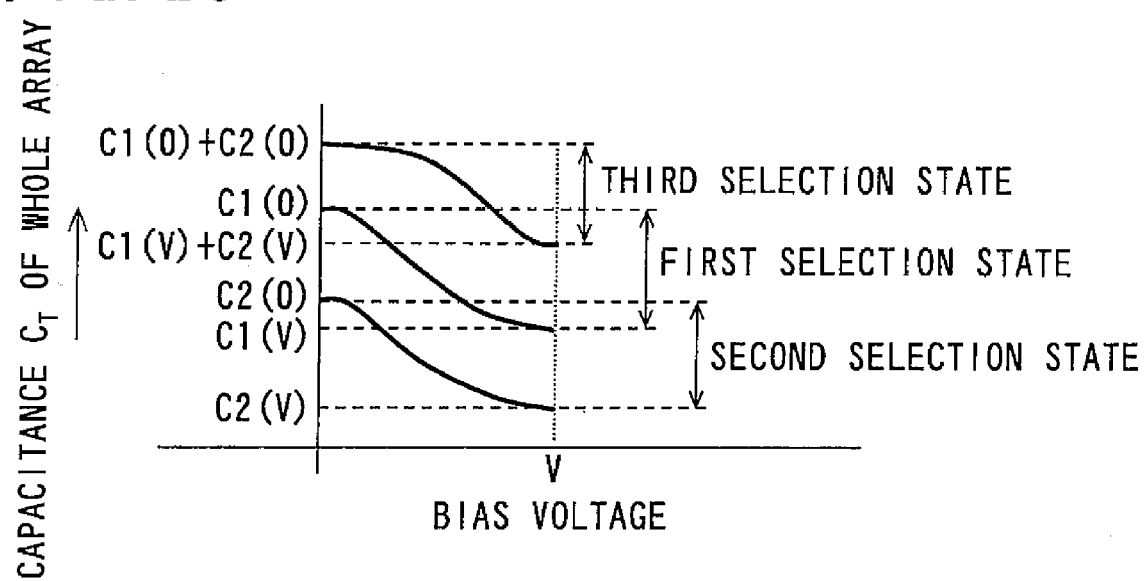

FIG. 1 and FIGS. 2A to 2C each show a variable capacitor array according to the first embodiment of the invention, and FIG. 1 is an equivalent circuit schematic and FIGS. 2A to 2C are diagrammatic view for explaining characteristics.

Note that in all the drawings, the same portions is denoted by the same numerals and symbols and the same explanations thereof is not repeated.

In the equivalent circuit schematic of FIG. 1, the symbols C1 and C2 denote the first and second variable capacitors, respectively, and the symbols O1, O2, and I denote the first terminal, the second terminal, and the third terminal, respectively, through each of which high frequency signals are inputted and outputted.

As shown in FIG. 1, the variable capacitor array includes the first and second variable capacitors C1 and C2 connected to between the first terminal O1 and the third terminal I and between the second terminal O2 and the third terminal I, respectively. Further, in the example shown in FIG. 1, the first terminal O1 to the third terminal I are also used as terminals to which bias voltages (direct-current voltages) are applied. Through the first terminal O1 to the third terminal I as just described, the high frequency signals and the bias voltages are applied to the first and second variable capacitors C1 and C2, respectively, in a superimposed manner.

In the variable capacitor array of the invention shown in FIG. 1, one selection state can be selected by switching among the three selection states, i.e., the first selection state that the first terminal O1 and the third terminal I are selected, the second selection state that the second terminal O2 and the third terminal I are selected, and the third selection state that the first selection state and the second selection state are selected simultaneously. And in each selection state, the capacitance of the first or second variable capacitor can be caused to vary according to application of the bias voltage between the third terminal I and the first terminal O1 or second terminal O2 with the high frequency signals applied between the third terminal I and the first terminal O1 or second terminal O2. That is, in the case where the first selection state is selected, the capacitance of the first variable capacitor C1 can be changed gradually according to the application of bias voltage from the capacitance before bias voltage application to the capacitance after bias voltage application. In the case where the second selection state is selected, the capacitance of the second variable capacitor C2 can be gradually changed from the capacitance before voltage application to the capacitance after voltage application. In the case where the third selection state is selected, the capacitances of the first and second variable capacitors C1 and C2 from a sum total of the capacitances before voltage application to a sum total of the capacitances after voltage application.

Now, when any one selection state is selected by switching between at least two selection states among the three selections states, the capacitance of the whole variable capacitor array can vary not only in a variable range of capacitance by voltage application from the capacitance before voltage application in one selection state, but also in a variable range of capacitance by voltage application in at least another selection state, therefore allowing for higher apparent tunability of the whole variable capacitor array.

The variable capacitor array of the invention is further described with reference to FIGS. 2A to 2C. FIGS. 2A to 2C are diagrammatic views each showing a relationship between the capacitance $C_T$ of the whole variable capacitor array and the bias voltage with at least two selection states switched among the first selection state, the second selection state, and the third selection state, of the variable capacitor array of the invention.

FIRST EXAMPLE

FIG. 2A shows the relationship between the capacitance $C_T$ of the whole variable capacitor array and the bias voltage in the variable capacitor array of the invention where the capacitance values of the first variable capacitor C1 and the second variable capacitor C2 satisfy the following expressions (1) and (2).

$$C1(0) \geqq C2(0) \quad (1)$$

$$C1(0) \geqq C1(V) + C2(V) \quad (2)$$

wherein, as described above, C1(0) and C1(V) respectively represent the capacitances of the first variable capacitor before and after voltage application, and C2(0) and C2(V) respectively represent the capacitances of the second variable capacitor before and after voltage application.

As shown in FIG. 2A, when one of the first and the third selection states is selected by switching between the first selection state and the third selection state under the condition that the expressions (1) and (2) are satisfied, the variable capacitance range in the third selection state and the variable capacitance range in the first selection state partially overlap with each other so that the capacitances can be changed continuously. As a result, the capacitance can vary continuously in a wide range, and it is therefore possible to realize a variable capacitor having high tunability. Note that C2(0) in FIG. 2A is not shown because it is only required to be equal to or lower than C1(0).

Note that when C1(0) is equal to C2(0), the same effect can be obtained also in the case where one state is selected by switching between the second selection state substituted for the first selection state and the third selection state.

Further, when C2(0) is larger than C1(V)+C2(V), the capacitances can be continuously changed by switching the third selection state to the second selection state.

In this regard, when the dielectric layers of the first and second variable capacitors C1 and C2 in the variable capacitor array configured as described above are formed of the same material in the same process and have the same thickness, the first and second variable capacitors C1 and C2 have substantially the same tunability x. Such a case is described more specifically that the first and second variable capacitors C1 and C2 have substantially the same tunability x (which is hereinbelow referred to as the case of the same tunability).

In the case of the same tunability, the capacitances of the first and second variable capacitors C1 and C2 are given in the following expressions.

$$C1(V) = C1(0) \times (1-x) \quad (8)$$

$$C2(V) = C2(0) \times (1-x) \quad (9)$$

Using the expression (8) and the expression (9), the expression (2) is rewritten to the following expression (10).

$$C2(0) \leqq x \times C1(0)/(1-x) \quad (10)$$

First of all, when the capacitance of the first variable capacitor before voltage application and the capacitance of the second variable capacitor after voltage application are equal (C1(0)=C2(0)), the expression (2) is satisfied with the tunability x of 50% or more (x≧0.5), which thus satisfies the relationship of FIG. 2A. Accordingly, when the third selection state is switched to the first or second selection state, the variable capacitance range on lower limit side in the third selection state and the variable capacitance range on upper limit side in the first or second selection state overlap with each other so that the capacitance of the whole variable capacitor array can be changed continuously in a wide range. For example, x=0.5 results in C1(0)=C1(V)+C2(V) which means that a lower limit of the variable capacitance range in the third selection state is equated to un upper limit of the variable capacitance range in the first or second selection state, and the tunability x of the whole variable capacitor array is now 75%, resulting in that the capacitances can be changed continuously in a wide range.

Next, the case of the same tunability where the capacitance of the first variable capacitor C1 before voltage application is different from the capacitance of the second variable capacitor C2 before voltage application is described.

Taking the case where the capacitance C1(0) of the first variable capacitor C1 before voltage application is greater than the capacitance C2(0) of the second variable capacitor C2 before voltage application (C1(0)>C2(0)) and where the expression (2) is satisfied, that is, the expression (10) is satisfied, then the relationship of FIG. 2A is satisfied. Especially with C2(0)=x×C1(0)/(1-x) satisfied, the lower limit of the variable capacitance range in the third selection state is equated to the upper limit of the variable capacitance range in the first selection state, which can maximize the variable range of capacitances. The apparent tunability X of the whole variable capacitor array is thus variable in a wide range, and it is therefore possible to realize the variable capacitor array having high tunability.

Now, Table 1 shows the variation of capacitance value in the whole variable capacitor array of an example where the tunability x=0.3, $C1(0)$=1 pF, and $C2(0)$=x×$C1(0)$/(1−x)= 0.3×1/(1−0.3)=0.43 pF.

Note that the above example shows a commonly-used variable capacitor which has a dielectric layer formed of BST and to which an applied bias voltage is up to 3.0 V.

TABLE 1

| $C_T$ | | SW1 | SW2 | DC bias | Capacitance value of $C_T$ (pF) | Tunability X of $C_T$ (%) |
|---|---|---|---|---|---|---|
| a | C1 + C2 | ON | ON | OFF | 1.43 | 79.0 |
| b | (C1 + C2)(1 − x) | ON | ON | ON | 1.00 | |
| c | C1 | ON | OFF | OFF | 1.00 | |
| d | C1(1 − x) | ON | OFF | ON | 0.70 | |
| e | C2 | OFF | ON | OFF | 0.43 | |
| f | C2(1 − x) | OFF | ON | ON | 0.30 | |

*C1 = 1 pF, C2 = 0.3 × 1/(1 − 0.3) = 0.43 pF, x = 0.3

In Table, C1 represents C1(O), C2 represents C2(0), and $C_T$ represents the capacitance of the whole variable capacitor array.

In Table 1, $C_T$ represents a capacitance value of the whole variable capacitor array, SW1 represents a switching element for selecting the first terminal O1 and the third terminal I, SW2 represents a switching element for selecting the second terminal O2 and the third terminal I, and the DC bias represents a bias voltage (the same applies to the following tables). The switching elements described in this section is described again hereinbelow with reference to FIG. 8A.

As shown in Table 1, the capacitance value $C_T$ of the whole variable capacitor array is the highest at pre-application of the bias voltage (a) in the third selection state (a, b), and becomes smaller continuously by application of the bias voltage (b). Next, the third selection state is switched to the first selection state of pre-application of the bias voltage (c) where the capacitance value at pre-application of the bias voltage in the first selection state is equal to the above capacitance value. And then, the capacitance value becomes smaller continuously by application of the bias voltage (d).

As just described, the capacitance value can be changed continuously in the range of 0.7 pF to 1.43 pF by selecting the connection (ON) state or disconnection (OFF) state of the switching element SW1 and switching element SW2 as well as the bias voltage applied (ON) state or not applied (OFF) state, and it is thereby possible to realize a variable capacitor array having tunability X of 51.0%.

Note that upon switching from the state of (d) to the second selection state (e, f), the capacitance value is discrete from the capacitance value at post-application of the bias voltage (d) in the first selection state to the capacitance value at pre-application of the bias voltage (e) in the second selection state, but becomes smaller continuously to the minimum by application of the bias voltage (f).

As just described, the tolerance for the partial discrete region enables the capacitance value to vary in the range of 0.3 pF to 1.43 pF and it is thereby possible to realize a variable capacitor array having tunability X of up to 79.0%.

Because the capacitances can be changed continuously at least upon selection by switching between the first selection state and the third selection state, it is possible to cause the capacitances to vary continuously in a wide range and thereby possible to realize a variable capacitor array having high tunability.

SECOND EXAMPLE

FIG. 2B shows the relationship between the capacitance $C_T$ of the whole variable capacitor array and the bias voltage in the variable capacitor array of the invention where the capacitance values of the first variable capacitor C1 and the second variable capacitor C2 satisfy all the following expressions (3) and (4).

$$C1(0) \geq C2(0) \quad (3)$$

$$C2(0) \geq C1(V) \quad (4)$$

wherein C1(0) and C1(V) respectively represent the capacitances of the first variable capacitor before and after voltage application, and C2(0) and C2(V) respectively represent the capacitances of the second variable capacitor before and after voltage application.

As shown in FIG. 2B, when one selection state is selected by switching between the first selection state and the second selection state under the condition that the expressions (3) and (4) are satisfied, the variable capacitance range in the first selection state and the variable capacitance range in the second selection state partially overlap with each other, whereby the capacitances can be changed continuously. As a result, the capacitance can vary continuously in a wide range, and it is therefore possible to realize a variable capacitor array having high tunability.

Now, considering the case of the same tunability just as did in the first example, the expression (4) is rewritten to the following expression (11) by using the expression (8).

$$C2(0) \geq C1(0) \times (1-x) \quad (11)$$

Taking the case where the capacitance C1(0) of the first variable capacitor C1 before voltage application is greater than the capacitance C2(0) of the second variable capacitor C2 before voltage application (C1(0)>C2(0)) and where the expression (4) is satisfied, that is, the expression (11) is satisfied, then the relationship of FIG. 2B is satisfied. Especially with C2(0)=C1(0)×(1−x) satisfied, the lower limit of the variable capacitance range in the first selection state is equated to the upper limit of the variable capacitance range in the second selection state, which can maximize the variable range of capacitances. The apparent tunability X of the whole variable capacitor array is thus variable in a wide range, and it is therefore possible to realize the variable capacitor array having high tunability.

Now, Table 2 shows the variation of capacitance value in the whole variable capacitor array of an example where the tunability x=0.3, C1(0)=1 pF, and C2(0)=1×(1−C1(0))=1× (1−0.3)=0.7 pF.

TABLE 2

| $C_T$ | | SW1 | SW2 | DC bias | Capacitance value of $C_T$ (pF) | Tunability X of $C_T$ (%) |
|---|---|---|---|---|---|---|
| a | C1 + C2 | ON | ON | OFF | 1.70 | 71.1 |
| b | (C1 + C2)(1 − x) | ON | ON | ON | 1.19 | |
| c | C1 | ON | OFF | OFF | 1.00 | |
| d | C1(1 − x) | ON | OFF | ON | 0.70 | |
| e | C2 | OFF | ON | OFF | 0.70 | |
| f | C2(1 − x) | OFF | ON | ON | 0.49 | |

*C1 = 1 pF, C2 = 1 × (1 − 0.3) = 0.7 pF, x = 0.3

In Table, C1 represents C1(0), C2 represents C2(0), and $C_T$ represents the capacitance of the whole variable capacitor array.

As shown in Table 2, in switching to the first selection state (c, d), the capacitance value $C_T$ of the whole variable capacitor array becomes smaller continuously by application of the bias voltage (d) from the capacitance value at pre-application of bias voltage (c) in the first selection state. Next, the first selection state is switched to the second selection state where the capacitance value at pre-application of the bias voltage (e) is equal to the above capacitance value. And then, the capacitance value becomes smaller continuously to the minimum by application of the bias voltage (f).

As just described, the capacitance value can be changed continuously in the range of 1.00 pF to 1.49 pF by selecting the connection (ON) state or disconnection (OFF) state of the switching element SW1 and switching element SW2 as well as the bias voltage applied (ON) state or not applied (OFF) state, and it is thereby possible to realize a variable capacitor array having tunability X of 51%.

Note that the capacitance value $C_T$ of the whole variable capacitor array is the highest at pre-application of the bias voltage (a) in the third selection state (a, b) and becomes smaller continuously by application of the bias voltage (b). When the third selection state is switched to the first selection state (c, d), the capacitance value is discrete from the capacitance value at post-application of the bias voltage (b) in the third selection state to the capacitance value at pre-application of the bias voltage (c) in the first selection state, but it is possible to add the variable capacitance range in the third selection state to the above-mentioned variable capacitance ranges in the first and second selection states.

As just described, the tolerance for the partial discrete region enables the capacitance value to vary in the range of 0.49 pF to 1.7 pF and it is thereby possible to realize a variable capacitor array having tunability X of up to 71.1%.

Because the capacitances can be changed continuously at least upon selection by switching between the first selection state and the second selection state, it is possible to cause the capacitances to vary continuously in a wide range and thereby possible to realize a variable capacitor array having high tunability.

THIRD EXAMPLE

FIG. 2C shows the relationship between the capacitance $C_T$ of the whole variable capacitor array and the bias voltage in the variable capacitor array of the invention where the capacitance values of the first variable capacitor C1 and the second variable capacitor C2 satisfy all the following expressions (5) to (7).

$$C1(0) \geq C2(0) \tag{5}$$

$$C1(0) \geq C1(V) + C2(V) \tag{6}$$

$$C2(0) \geq C1(V) \tag{7}$$

wherein C1(0) and C1(V) respectively represent the capacitances of the first variable capacitor before and after voltage application, and C2(0) and C2(V) respectively represent the capacitances of the second variable capacitor before and after voltage application.

As shown in FIG. 2C, under the condition that the expressions (5) to (7) are satisfied, the variable capacitance range in the third selection state and the variable capacitance range in the first selection state partially overlap with each other, and the variable capacitance range in the first selection state and the variable capacitance range in the second selection state partially overlap with each other, whereby the capacitances can be changed continuously. As a result, the capacitance can vary continuously in a wider range, and it is therefore possible to realize a variable capacitor having high tunability.

Now, considering the case of the same tunability just as did in the first example, the expression (6) and the expression (7) are rewritten to the following expression (12) by using the expression (8) and the expression (9).

$$C1(0) \times (1-x) \leq C2(0) \leq x \times C1(0)/(1-x) \tag{12}$$

Taking the case where the capacitance C1(0) of the first variable capacitor C1 before voltage application is greater than the capacitance C2(0) of the second variable capacitor C2 before voltage application (C1(0)>C2(0)) and where the expression (6) and the expression (7) are satisfied, that is, the expression (12) is satisfied, then the relationship of FIG. 2C is satisfied. Especially with the tunability x of $(3-\sqrt{5})/2$ or more (about 0.382 or more) and C2(0)=C1(0)×(1−x) satisfied, an overlap of the variable capacitance ranges in the respective selection states can be smaller, whereby the variable range of capacitances can be maximized. Especially the overlap of the variable capacitance ranges in the first selection state and the second selection state can be eliminated.

Now, Table 3 shows the variation of capacitance value in the whole variable capacitor array of an example where the tunability x=0.385, C1(0)=1 pF, and C2(0)=C1(0)×(1−X)= 1×(1−0.385)=0.615 pF.

TABLE 3

| | $C_T$ | SW1 | SW2 | DC bias | Capacitance value of $C_T$ (pF) | Tunability X of $C_T$ (%) |
|---|---|---|---|---|---|---|
| a | C1 + C2 | ON | ON | OFF | 1.615 | 76.6 |
| b | (C1 + C2)(1 − x) | ON | ON | ON | 0.993 | |
| c | C1 | ON | OFF | OFF | 1.000 | |
| d | C1(1 − x) | ON | OFF | ON | 0.615 | |
| e | C2 | OFF | ON | OFF | 0.615 | |
| f | C2(1 − x) | OFF | ON | ON | 0.378 | |

*C1 = 1 pF, C2 = 1 × (1 − 0.385) = 0.615 pF, x = 0.385

In Table, C1 represents C1(0), C2 represents C2(0), and $C_T$ represents the capacitance of the whole variable capacitor array.

As shown in Table 3, the capacitance value $C_T$ of the whole variable capacitor array is the highest at pre-application of the bias voltage (a) in the third selection state (a, b) and becomes smaller continuously by application of the bias voltage (b). Next, the third selection state is switched to the first selection state with the capacitance value at pre-application of the bias voltage (c), and the capacitance value then becomes smaller continuously by application of the bias voltage (d). Next, the first selection state is switched to the second selection state where the capacitance value at pre-application of the bias voltage (e) is equal to the above capacitance value. And then, the capacitance value becomes smaller continuously to the minimum by application of the bias voltage (f). That is to say, the capacitances can be changed continuously even in sequential switching from the third connection state to the first connection state and then the second connection state.

As just described, the capacitance value can be changed continuously in the range of 0.378 pF to 1.615 pF by selecting the connection (ON) state or disconnection (OFF) state of the switching element SW1 and switching element SW2 as well as the bias voltage applied (ON) state or not applied (OFF) state, and it is thereby possible to realize a variable capacitor array having apparent tunability X of up to 76.6%.

Since the capacitance can be changed continuously in switching to any selection state among the three selection states, the capacitance can vary continuously in a wider range, and it is therefore possible to realize a variable capacitor array having high tunability.

In addition, in the case shown in Table 3 although the overlap of the variable capacitance ranges in the first selection state and the second selection state is eliminated, the overlap of the variable capacitance ranges in the first selection state and the third selection state may be eliminated. That is to say, the setting may be made to satisfy that the tunability x is equal to or more than $(3-\sqrt{5})/2$ (about 0.382) and that $C2(0)=x \times C1(0)/(1-x)$.

Now, Table 4 shows the variation of capacitance value in the whole variable capacitor array of an example where the tunability $x=0.385$, $C1(0)=1$ pF, and $C2(0)$ is set at 0.627 pF that is a little larger than a resultant of $x \times C1(0)/(1-x)$, about 0.626 pF.

TABLE 4

| | $C_T$ | SW1 | SW2 | DC bias | Capacitance value of $C_T$ (pF) | Tunability X of $C_T$ (%) |
|---|---|---|---|---|---|---|
| a | C1 + C2 | ON | ON | OFF | 1.627 | 76.2 |
| b | (C1 + C2)(1 − x) | ON | ON | ON | 1.000 | |
| c | C1 | ON | OFF | OFF | 1.000 | |
| d | C1(1 − x) | ON | OFF | ON | 0.615 | |
| e | C2 | OFF | ON | OFF | 0.627 | |
| f | C2(1 − x) | OFF | ON | ON | 0.386 | |

*C1 = 1 pF, C2 = 0.627 pF, x = 0.385

In Table, C1 represents C1(0), C2 represents C2(0), and $C_T$ represents the capacitance of the whole variable capacitor array.

Even in the case shown in Table 4, the capacitance value can be changed continuously, as in the case shown in Table 3, in the range of 0.386 pF to 1.627 pF by selecting the connection (ON) state or disconnection (OFF) state of the switching element SW1 and switching element SW2 as well as the bias voltage applied (ON) state or not-applied (OFF) state, and it is thereby possible to realize a variable capacitor array having apparent tunability X of up to 76.2%.

That is to say, the capacitance can be changed continuously in switching to any selection state among the three selection states, and therefore the capacitance can vary continuously in a wider range, and it is therefore possible to realize a variable capacitor array having high tunability. Especially, the overlap of the variable capacitance ranges in the first selection state and the third selection state can be eliminated.

As described above, according to the variable capacitor array of the present application, the tunability is drastically high and especially by increasing the initial capacitance C1(0) of the first variable capacitor relative to the initial capacitance C2(0) of the second variable capacitor, it is possible to realize high tunability even with a commonly-used material that can be mass-produced.

Further, as described above, BST is used for the dielectric layer and the applied bias voltage is up to 3.0 V in each of the examples of Table 1 to Table 4. The level of applicable bias voltage is generally less than 3.6 V for a variable capacitor array mounted on a mobile phone, and it is therefore possible to mount the variable capacitor array on a mobile phone and thereby obtain desired characteristics. Note that the variable capacitor tends to have a lower rate of capacitance change with higher bias voltage and thus, the expected capacitance variation is small with the bias voltage higher than a certain level. Moreover, the increase in the bias voltage may cause an insulation breakdown which leads to failure. However, according to the invention, it is possible to obtain tunability desired for the variable capacitor array with a high rate of capacitance change and the bias voltage which does not cause the insulation breakdown.

Figure 3:
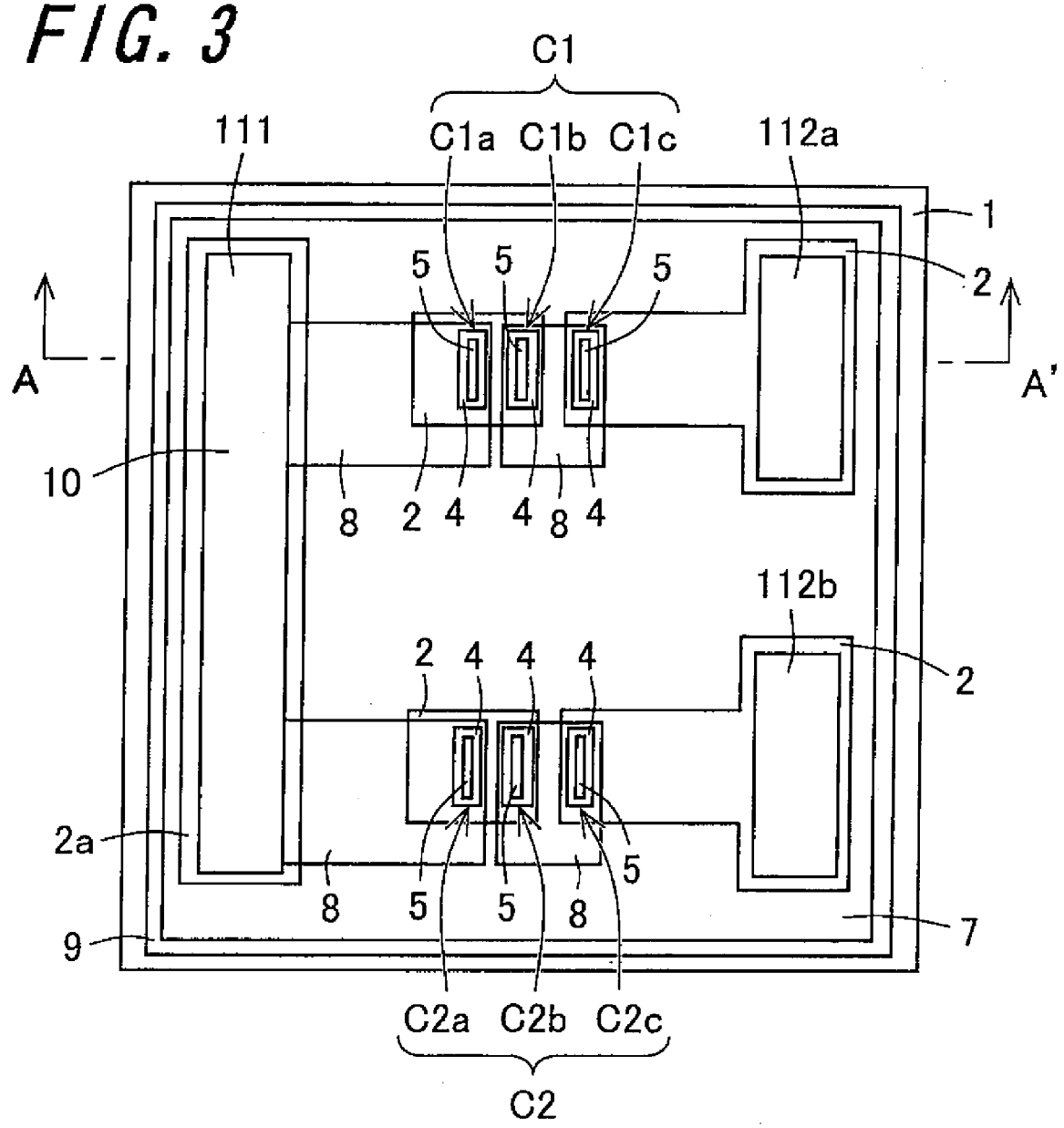
FIG. 3 is a perspective plan view schematically showing the variable capacitor array according to the first embodiment of the invention.

Next, a specific configuration of the above-mentioned variable capacitor array is described with reference to FIGS. 3 and 4. FIG. 3 is a perspective plan view schematically showing one example of the variable capacitor array of the invention, and FIG. 4 is a sectional view taken one line A-A' of FIG. 3.

Further, in the variable capacitor array, it is preferable that at least one of the first and second variable capacitors has a variable capacitance element group including N pieces (where N is a natural number) of variable capacitance elements connected in series, and a group of first separate bias lines and a group of second separate bias lines which are alternately connected to both ends of the variable capacitance element group and between adjacent pieces of the variable capacitance elements, in one array direction of the variable capacitance elements.

Figure 4:
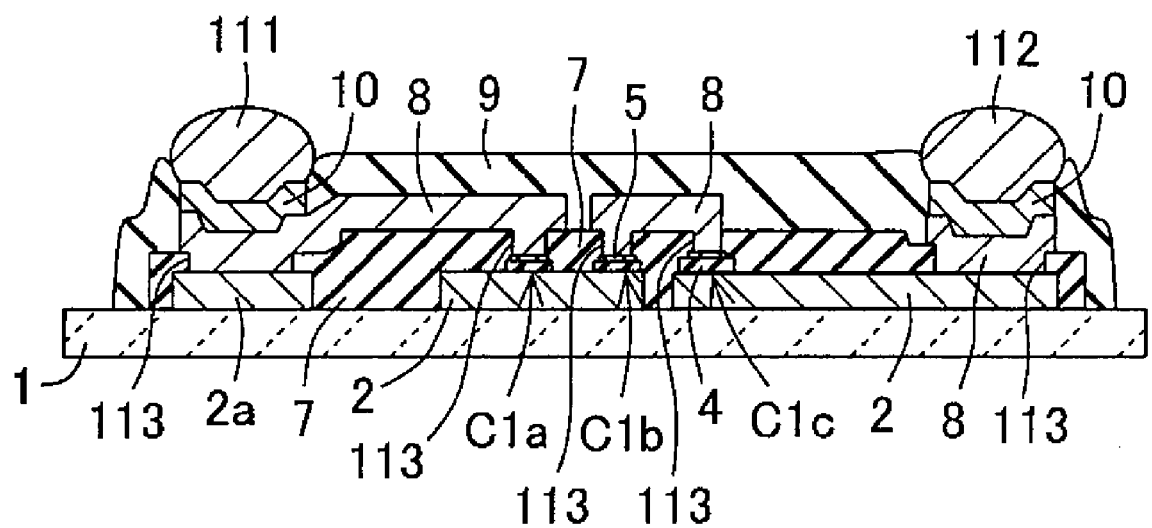
FIG. 4 is a sectional view taken one line A-A' of the variable capacitor array of FIG. 3.

In FIGS. 3 and 4, reference numeral 1 denotes a supporting substrate; reference numeral 2 denotes a lower electrode layer; reference numeral 4 denotes a dielectric layer with dielectric constant which is varied according to application of voltage; reference numeral 5 denotes an upper electrode layer; reference numeral 7 denotes an insulting layer; reference numeral 8 denotes an extraction electrode layer; reference numeral 9 denotes a protective layer; reference numeral 10 denotes a solder spread prevention layer; and reference numerals 111, 112a and 112b denote solder terminal portions. Note that the solder spread prevention layer 10 and any of the solder terminal portions 111, 112a, and 112b constitute the third terminal I, the first terminal O1, and the second terminal O2. Further, the lower electrode layer 2 and the upper electrode layer 5 constitute a pair of electrodes sandwiching the dielectric layer 4 therebetween. Furthermore, the first and second variable capacitors C1 and C2 each constitute the variable capacitance element group including N pieces (where N is a natural number of two or more, and the figures show the example of N=3) of variable capacitance elements C1a, C1b, C1c, and C2a, C2b, C2c connected in series.

In the case where the variable capacitors C1 and C2 constitute the variable capacitance element group as described above, the electrodes not connected to other variable capacitance elements are referred to as one electrode and the other electrode, respectively, among the pairs of electrodes of the variable capacitance elements located on both ends of the variable capacitance elements in the array direction. And the solder terminal portion 112a constituting a part of the first terminal O1 is connected to one electrode of the first variable capacitor C1; the solder terminal portion 111 constituting a part of the third terminal I is connected to the other electrode of the first variable capacitor C1; the solder terminal portion 112b constituting a part of the second terminal O2 is connected to one electrode of the second variable capacitor C2; and the solder terminal portion 111 constituting a part of the third terminal I is connected to the other electrode of the second variable capacitor C2.

The first and second variable capacitors C1 and C2 constitute the variable capacitance element group having a plurality of the variable capacitance elements connected in series as described above. Therefore, when the high frequency signal is applied between the solder terminal portion 111 constituting a part of the third terminal I and the solder terminal portion 112a constituting a part of the first terminal O1 or the solder terminal portion 112b constituting a part of the second terminal O2, the high frequency voltage is divided, thereby allowing for reduction in the high frequency signal-induced capacitance change, distortion, etc., as well as enhancement of power handling capability.

The supporting substrate 1 may be a ceramic substrate made of alumina ceramics or a single-crystal substrate made of sapphire can be used. And the lower electrode layer 2, the dielectric layer 4, and the upper electrode layer 5 are sequentially deposited on the supporting substrate 1 so that an almost entire surface of the supporting substrate 1 is covered. After the deposition of these respective layers is completed, the upper electrode layer 5, the dielectric layer 4, and the lower electrode layer 2 are etched in predetermined shapes sequentially in the descending order of position. Note that in order to connect the variable capacitance element group in series from the later-described solder terminal portion 111 to the solder terminal portions 112a and 112b, the patterning is done so that the variable capacitance elements C1a and C1b and the variable capacitance elements C2a and C2b share the lower electrode layer 2.

The lower electrode layer 2 is preferably made of a material having a high melting temperature because typically high-temperature sputtering often needs to be done to form the dielectric layer 4. To be specific, it is preferable to use a metal material such as Pt and PdIr or an oxide conductive material such as $IrO_2$. Furthermore, after the lower electrode layer 2 is formed, the lower electrode layer 2 is heated up to 700 to 900° C. which is a sputtering temperature of the dielectric layer 4, and maintained for a predetermined length of time until the sputtering of the dielectric layer 4 starts, thereby resulting in a flat film. The reason for the result is still not clear, but presumably the lower electrode layer 2 becomes flat so that its surface energy decreases under high temperature.

When the lower electrode layer 2 is so thin as to generate non-formed parts, the resistance may increase at such sites, and it is therefore desirable to have a larger thickness in view of continuity of the lower electrode layer 2. On the other hand, in view of adhesion to the supporting substrate 1, it is desirable to have a smaller thickness. Both of the results are taken into consideration to determine the thickness of the lower electrode layer 2. To be specific, the thickness is 0.1 μm to 10 μm. When the lower electrode layer 2 has a thickness less than 0.1 μm, the electrode itself has higher resistance and in addition, the continuity of the electrode may not be secured because the non-formed parts are generated to form discontinuous parts at which the connection is cut, or the like. And when the thickness is larger than 10 μm, the adhesion to the supporting substrate 1 may decrease or the supporting substrate 1 may warp.

Further, in order to make it easy to connect the first and second variable capacitors C1 and C2 and the solder terminal portions 111, 112a, and 112b which are formed later, a conductive layer 2a is formed at a position which is away from the region that the first and second variable capacitors C1 and C2 are formed and at which the solder terminal portion 111 is formed, and the lower electrode layers 2 of the variable capacitance elements C1c and C2c are formed to extend to positions where the solder terminal portions 112a and 112b are formed on the supporting substrate 1. The conductive layer 2a may be made of any conductive material without particular limitation and may be formed of the same material in the same process as the lower electrode layer 2 by patterning the conductive layer 2a at the same time as the patterning of the lower electrode layer 2.

The dielectric layer 4 is preferably a dielectric layer which is high in dielectric constant and made of perovskite crystalline oxide containing at least Ba, Sr, and Ti. The dielectric layer 4 is formed on an upper surface of the above-described lower electrode layer 2. For example, the dielectric layer 4 is formed by depositing a layer up to a desired thickness in the sputtering method using as a target a dielectric material from which the perovskite crystalline oxide can be obtained. In this case, by performing the sputtering operation with the supporting substrate 1 having a temperature increased to a high level such as 800° C., it is possible to obtain the dielectric layer 4 having high dielectric constant and high rate of capacitance change with low loss without heat treatment after the sputtering operation.

For the material of the upper electrode layer 5, it is desirable to use Au having low resistivity in order to decrease the resistance of the electrode. In addition, it is desirable to use Pt or the like substance for an adhesive layer in order to enhance the adhesion between the upper electrode layer 5 and the dielectric layer 4. A thickness of the upper electrode layer 5 is 0.1 μm to 10 μm. A lower limit of this thickness is set at in view of the resistance of the electrode itself as in the case of the lower electrode layer 2. And an upper limit of the thickness is set in view of the adhesion to the dielectric layer 4.

Now, the capacitances of the first and second variable capacitors C1 and C2 before voltage application (initial capacitances) each depend on an overlap area of the lower electrode layer 2, the dielectric layer 4, and the upper electrode layer 5 (hereinafter referred to as a capacitance-formed portion) in planar view. In order to enhance the tunability of the whole variable capacitor array, the initial capacitance $C1(0)$ of the first variable capacitor C1 is preferably set to be larger than the initial capacitance $C2(0)$ of the second variable capacitor C2. In order to adjust the initial capacitances of the first and second variable capacitors C1 and C2, it is only necessary to change the areas of the capacitance-formed portions, that is, for example, to change the area of the capacitance-formed portions in the respective variable capacitance elements or to change the number of variable capacitance elements connected in series.

Next, the insulating layer 7 is used to securely insulate the extraction electrode layer 8 formed on the insulating layer, from the lower electrode layer 2, and covers the upper electrode layer 5 and touches an upper surface of the supporting substrate 1. In order to enhance moisture resistance, a material of the insulating layer 7 is preferably made of at least one of silicon nitride and silicon oxide. These are deposited desirably by a method that provides excellent step coverage even for a stepped base shape, that is, excellent coatability, which method is, for example, a chemical vapor deposition (CVD) method.

Further, the insulating layer 7 has openings 113 which expose parts of the upper surfaces of the upper electrode layers 5 of the respective variable capacitance elements C1a to C2c, and parts of the conductive layers 2a and the lower electrode layers 2 formed on positions where the solder terminal portions 111, 112a, and 112b are formed. The insulating layer 7 can be processed into a desired form such as to have the openings 113, by a dry etching method or the like using an ordinary resist. In view of enhancement of the moisture resistance, it is preferable that the sites exposed from the insulating layer 7 be only parts of the upper electrode layer 5 and the conductive layer 2a and lower electrode layer 2 where the solder terminal portions 111, 112a, and 112b are formed.

Next, the extraction electrode layer 8 is formed in order to connect the variable capacitance elements C1a, C1b, and C1c and the variable capacitance elements C2a, C2b, and C2c from the solder terminal portion 111 to the solder terminal portions 112a and 112b, and make connections between the solder terminal portion 111 and the variable capacitance elements C1a and C2a, between C1b and C1c, and between C2b and C2c. To be specific, the connections are made by way of the upper surface of the insulating layer 7 from the conductive layer 2a formed at the position where the solder terminal position 111 is formed, to the upper electrode layer 5 of the variable capacitance elements C1a and C2a, as well as from the upper electrode layer 5 of the variable capacitance elements C1b and C2b to the variable capacitance elements C1c and C2c, which are exposed from the insulating layer 7.

For a material of the extraction electrode layer 8, it is desirable to use a metal having low resistance such as Au or Cu. Further, in view of the adhesion between the extraction electrode layer 8 and the insulating layer 7, an adhesive layer made of Ti, Ni, or the like may be interposed between the insulating layer 7 and the extraction electrode layer 8. In addition, it is also desirable to form the extraction electrode layers 8 on the lower electrode layers 2 located at positions where the solder terminal portions 112a and 112b are formed. This aims to align height of the solder terminal portions 111, 112a, and 112b so as to make implementation easy.

Next, the protective layer 9 is formed to cover all the structure but the extraction electrode layers 8 which are exposed and located at the positions where the solder terminal portions 111, 112a, and 112b are formed. The protective layer 9 is to not only mechanically protect but also protect against contamination with chemicals, etc., the members constituting the variable capacitor array including the variable capacitors C1 and C2. For a material of the protective layer 9, it is preferable to use a material having high heat resistance and excellent coatability of steps, and to be specific, polyimide resin, BCB (benzocyclobutene) resin, or the like is used. These are formed by hardening at a predetermined temperature the resin material applied by the spin coat method.

The solder spread prevention layer 10 is formed on the extraction electrode layer 8 which is exposed from the protective layer 9 and located where the solder terminal portions 111, 112a, and 112b are formed. This aims to prevent the solder of the solder terminal portions 111, 112a, and 112b, from spreading to the electrode layers 2 and 8 of the solder terminal portions 111, 112a, and 112b at the reflow in forming the solder terminal portions 111, 112a, and 112b or upon implementation. For a material of the solder spread prevention layer 10, Ni is preferred. Further, in order to enhance solder wettability, about 0.1 μm-thick Au, Cu, or the like having high solder wettability may be formed on a surface of the solder spread prevention layer 10.

At the end, the solder terminal portions 111, 112a, and 112b are formed. These are formed to facilitate mounting of the variable capacitors on an external wiring substrate. These solder terminal portions 111, 112a, and 112b are typically formed by printing solder paste on the solder terminal portions 111, 112a, and 112b with use of a predetermined mask, followed by a reflow.

The above formation leads to the configuration that the variable capacitance elements C1a to C1c are connected in series between the solder terminal portion 111 and the solder terminal portion 112a as described below. That is to say, the solder terminal portion 111 is connected to the upper electrode layer 5 on the variable capacitance element C1a by way of the extraction electrode layer 8. The variable capacitance elements C1a and C1b are connected to each other by sharing the lower electrode layer 2. The variable capacitance elements C1b and C1c are connected to each other by connecting the upper electrode layers 5 by way of the extraction electrode layer 8. At the end, the variable capacitance element C1c and the solder terminal portion 112a are connected to each other by the lower electrode layer 2 of the variable capacitance element C1c extending to the position where the solder terminal portion 112a is formed. Note that the upper electrode layer 5 of the variable capacitance element C1a and the lower electrode layer 2 of the variable capacitance element C1c function respectively as the other electrode and one electrode of the variable capacitor C1. Likewise, the variable capacitance elements C2a to C2c are also connected in series between the solder terminal portion 111 and the solder terminal portion 112b.

Figure 5:
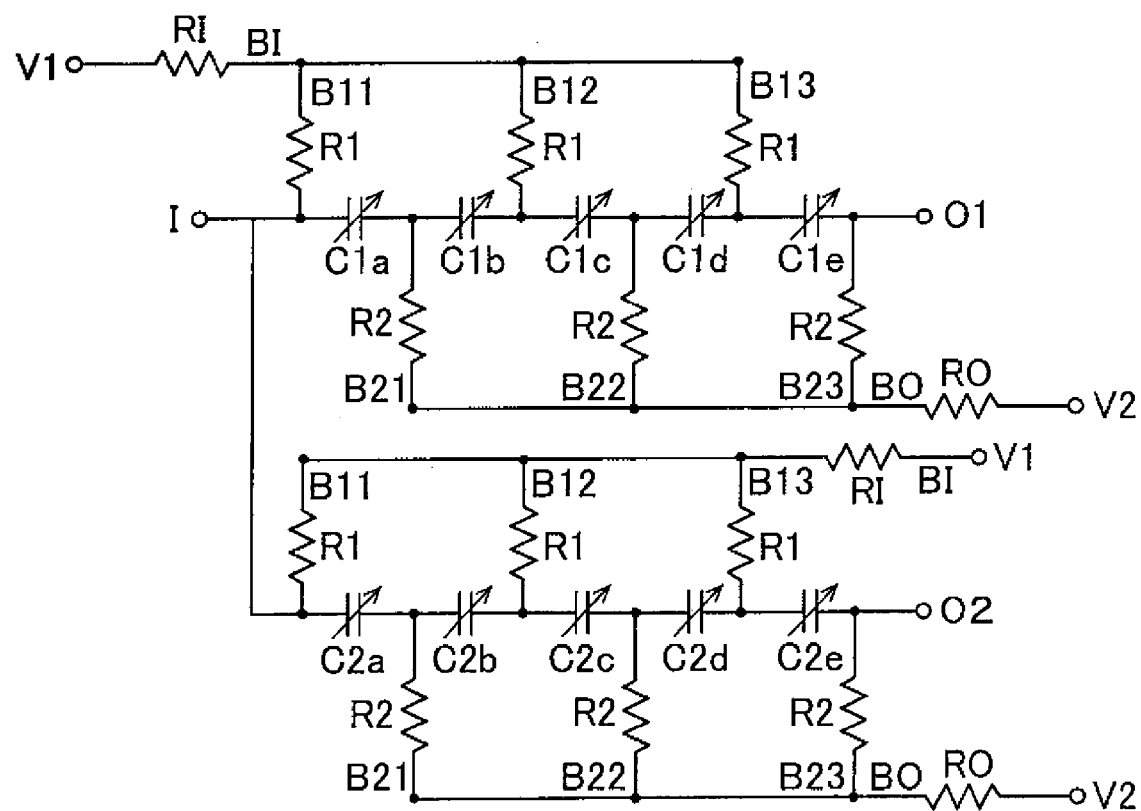
FIG. 5 is an equivalent circuit schematic showing a variable capacitor array according to the second embodiment of the invention.

FIG. 5 is an equivalent circuit schematic showing a variable capacitor array according to the second embodiment of the invention. In FIG. 5, reference symbols C1a to C1e denote the variable capacitance elements constituting the first variable capacitor C1; reference symbols C2a to C2e denote the variable capacitance elements constituting the second variable capacitor C2; reference symbol V1 denotes the first bias terminal; reference symbol V2 denotes the second bias terminal; reference symbols B11 to B13 denote the group of first separate bias lines; reference symbols B21 to B23 denote the group of second separate bias lines; reference symbol R1 denotes resistor components on the group of first separate bias lines B11 to B13; reference symbol R2 denotes resistor components on the group of second separate bias lines B21 to B23; reference symbol BI denotes the first common bias line; reference symbol BO denotes the second common bias line; reference symbol RI denotes a resistor component on the first common bias line; and reference symbol RO denotes a resistor component on the second common bias line.

The variable capacitor array shown in FIG. 5 has a configuration that five variable capacitance elements are connected in series as a variable capacitance element group, and includes, in addition to the configuration of the variable capacitor array shown in FIG. 1, the group of first separate bias lines B11 to B13 each having at least one of a resistor component or an inductor component (in FIG. 5, the resistor component R1) and the group of second separate bias lines B21 to B23 each having at least a resistor component or an inductor component (in FIG. 5, the resistor component R2), and the array is configured such that these ling groups are provided on both sides of the variable capacitance element group and connected alternately between adjacent pieces of the variable capacitance elements in one array direction of the variable capacitance elements.

As described above, in the variable capacitor array shown in FIG. 5, the group of first separate bias lines B11 to B13 and the group of second separate bias lines B21 to B23 are separately connected to the respective variable capacitance elements between the first terminal O1 or the second terminal O2 and the third terminal I so that the bias voltages are applied to the respective variable capacitance elements as follows.

That is to say, the bias voltages are applied between the first bias terminal V1 and the second bias terminal V2 through the first separate bias line B1, the variable capacitance element C1a, and the second separate bias line B21. Likewise, the bias voltages are applied separately to the variable capacitance elements C1b to C2c.

Further, the high frequency signal passes through the variable capacitance elements C1a to C1e and C2a to C2e between the third terminal I and the first and second terminals O1, O2. At this time, the resistor components R1 and R2 of the groups of first and second separate bias lines B11 to B23 are set to serve as high impedance components for impedance in the frequency region of high frequency signals in the variable capacitance elements C1a to C2e, and therefore do not exert harmful influences on high frequency band impedance. Moreover, the high frequency signal does not pass the groups of first and second separate bias lines B11 to B23 having high resistance.

As described above, in the variable capacitor array shown in FIG. 5, N pieces of the variable capacitance elements with dielectric constant which is varied by application of the voltage thereto are connected in parallel with respect to direct current. Furthermore, at least one of the resistor component or the inductance component is connected to the group of first separate bias lines and the group of second separate bias lines, with the result that N pieces of the variable capacitance elements with dielectric constant which is varied by application of the voltage thereto are connected in series with respect to high frequency. Owing to this configuration, a predetermined bias signal can be applied to each of the variable capacitance elements, thereby allowing for the best use of the tunability of each of the variable capacitance elements. Moreover, the high frequency voltage applied to the variable capacitor is divided for the respective variable capacitance elements and thus reduced, and it is therefore possible to reduce the capacitance variation in the variable capacitance element group, waveform distortion, intermodulation distortion, or the like, for the high frequency signal, as well as to decrease a calorific value per unit area due to loss resistance of each of the variable capacitance elements, therefore allowing for enhancement in power handling capability.

That is to say, according to the variable capacitor array of the invention, the variable capacitance element group has the respective variable capacitance elements connected in series with respect to high frequency, with the result that the high frequency voltage applied to the variable capacitor is divided for the respective variable capacitance elements and thus reduced, thereby allowing for reduction in the capacitance variation in the variable capacitance element group, waveform distortion, intermodulation distortion, or the like, for the high frequency signal. Moreover, when the high frequency voltage is divided, the calorific value can be smaller per unit area due to loss resistance of each of the variable capacitance elements, therefore allowing for enhancement in power handling capability. Furthermore, the group of first separate bias lines and the group of second separate bias lines are provided on both sides of the variable capacitance element group and connected alternately between the adjacent variable capacitance elements in one array direction of the variable capacitance elements, resulting in the configuration that N pieces of the variable capacitance elements with dielectric constant which is varied by application of the bias voltage are connected in parallel with respect to direct current so that the predetermined bias voltage can be applied separately to each of the variable capacitance elements, and it is thus possible to realize the variable capacitor array which has high tunability and can optimize the use of the tunability of each of the variable capacitance elements depending on the bias voltage.

Further, it is preferable that the variable capacitor array further include the first bias terminal to which the group of first separate bias lines is connected in common, and the second bias terminal to which the group of second separate bias lines is connected in common.

That is to say, the groups of first and second separate bias lines may be provided respectively with terminals to which the bias voltages are applied, but when the group of first separate bias lines B11 to B13 and the group of second separate bias lines B21 to B23 share the first and second bias voltage terminals V1 and V2 to which the groups of first and second separate bias lines are both connected as shown in FIG. 5, the bias voltages can be applied to the respective variable capacitance elements collectively, therefore allowing for reduction in size as well as leading to easy handling.

As stated above, it is not necessary to provide the terminals through which the voltages are applied separately to the groups of first and second separate bias lines, therefore allowing for reduction in size. Further, in the case where the resistor component or the inductor component is connected between the first and second bias terminals and between the groups of first and second separate bias lines, the bias supply circuit can be incorporated, thus allowing for further reduction in size.

To be specific, when the bias voltage is applied between the first bias terminal V1 and the second bias terminal V2, the bias voltage is applied among the first common bias line BI, the first separate bias line B11, the variable capacitance element C1a, the second separate bias line B21, and the second common bias line BO. Likewise, the bias voltages are separately applied also to the variable capacitance elements C1b to C2e.

Furthermore, as shown in FIG. 5, the variable capacitor array of the invention has the first common bias line BI including at least the resistor component or the inductor component (in FIG. 5, including the resistor component RI) and the second common bias line BO including at least the resistor component or the inductor component (in FIG. 5, including the resistor component RO), which are formed on one supporting substrate 1. As just described, the first and second common bias lines BI and BO each include at least the resistor component or the inductor component, with the result that a direct-current component (bias voltage) and an alternating-current component (high frequency signal) can be separated and as a result, an external bias supply circuit which used to be required is not required for the wiring substrate on which the variable capacitor array is mounted, thus allowing for reduction in size and leading to very easy handling.

Owing to the configuration as above, the high frequency signals and the bias voltages are applied to the respective variable capacitance elements C1a to C2e in a superimposed manner.

Note that in the example shown in FIG. 5, the variable capacitance element group composed of the odd number (five pieces) of variable capacitance elements has been described as an example, and the even number of variable capacitance elements are also applicable without any problem.

Figure 6:
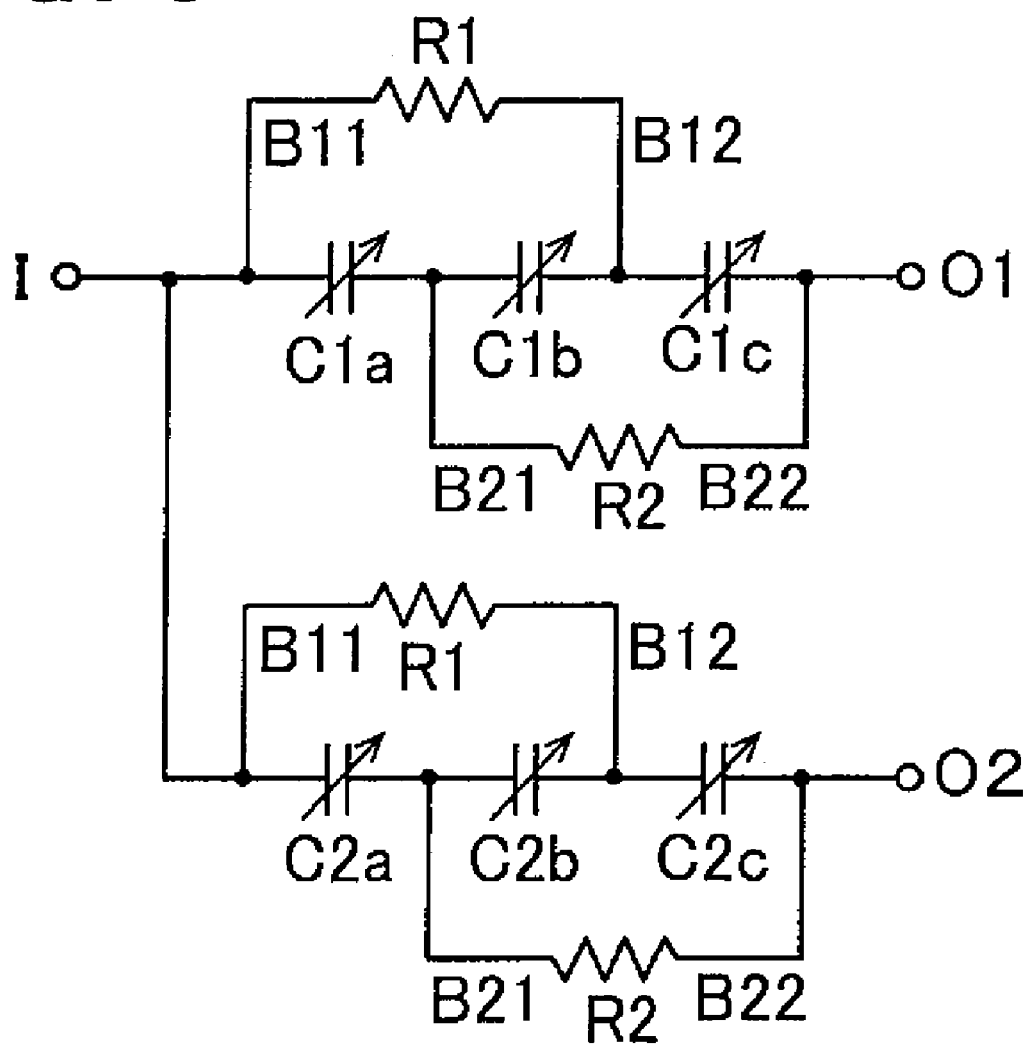
FIG. 6 is an equivalent circuit schematic showing a variable capacitor array according to the third embodiment of the invention.
Figure 7:
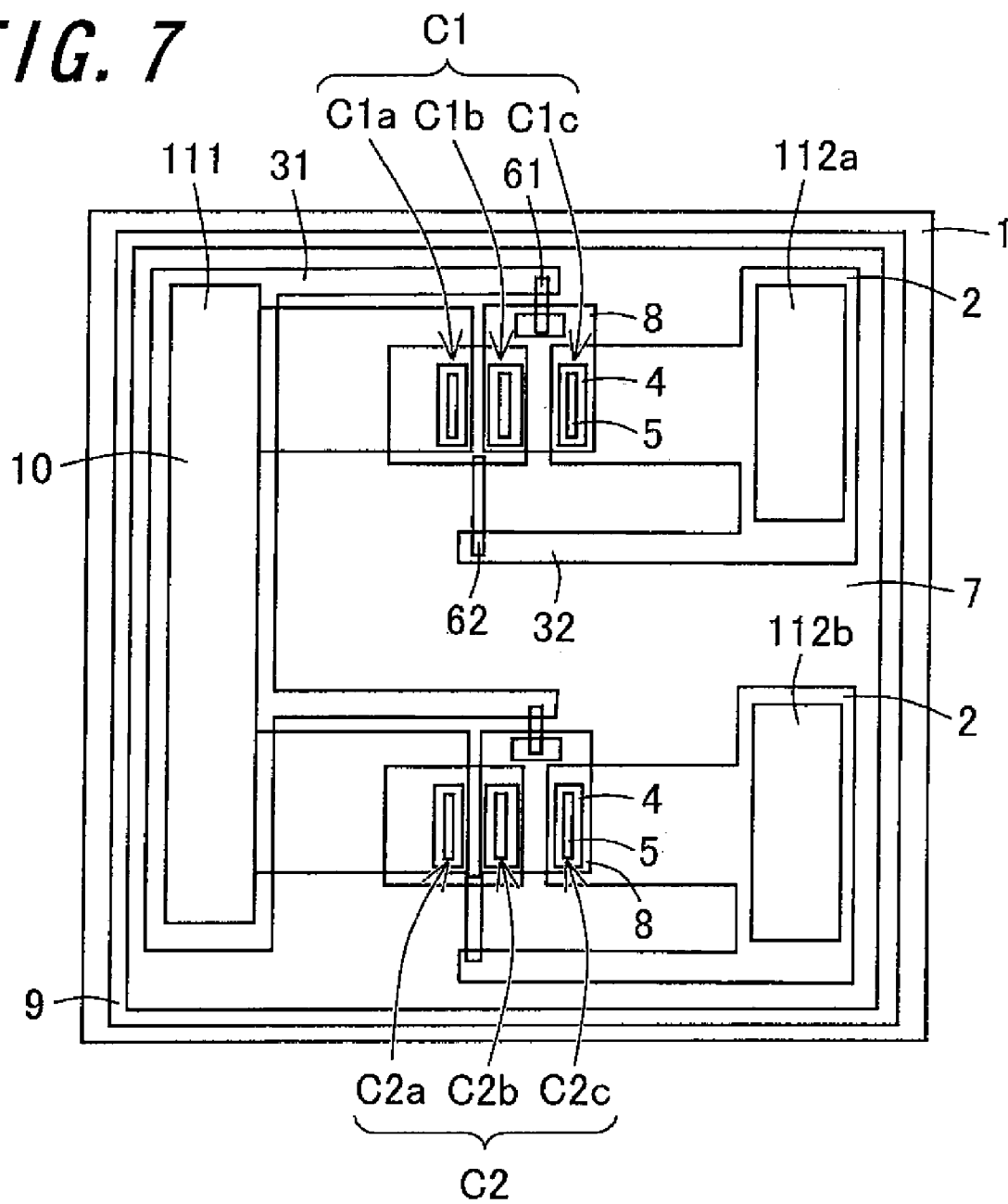
FIG. 7 is a perspective plan view schematically showing a variable capacitor array of the invention shown in FIG. 6.

FIG. 6 is an equivalent circuit schematic showing a variable capacitor array according to the third embodiment of the invention. FIG. 7 is its perspective plan view. In FIGS. 7, 31 and 32 denote conductor lines and 61 and 62 denote thin-film resistors.

It is preferable that the variable capacitance element group is composed of an odd number of the variable capacitance elements connected to each other, and the group of first separate bias lines is connected in common and the group of second separate bias lines is connected in common.

That is to say, in the variable capacitor array shown in FIG. 6, the variable capacitance element group is composed of the odd number (three pieces in FIG. 6) of variable capacitance elements connected to each other and has a configuration of the variable capacitor array shown in FIG. 5 from which the first and second bias terminals V1 and V2 and the first and second common bias lines BI and BO are removed. In the case where the variable capacitance element group is composed of the even number of variable capacitance elements, it is possible to provide the first terminal O1, the second terminal O2, and the third terminal I with functions of the first and second bias terminals V1 and V2. Through the first terminal O1, the second terminal O2, and the third terminal I as just described, the high frequency signals and the bias voltages are applied to the respective variable elements C1a to C2c in a superimposed manner.

The bias voltage for controlling the capacitance values of the variable capacitance elements C1a to C2c is supplied from the first terminal O1 or the second terminal O2 and then applied among the first terminal O1 or the second terminal O2, the variable capacitance elements C1a to C2c, and the third terminal I. To be specific, the bias signal supplied from the first terminal O1 is applied among the second separate bias lines B22 and B21, the variable capacitance element C1a, and the third terminal I. Likewise, the bias signal supplied form the first terminal O1 is applied among the second separate bias lines B22 and B21, the variable capacitance element C1b, the first separate bias lines B12 and B11, and the third terminal I. Furthermore, the bias signal supplied from the first terminal O1 is applied among the variable capacitance element C1c, the separate bias lines B12 and B11, and the third terminal I. As just described, the variable capacitance elements C1a to C1c are connected in parallel with respect to direct current between the first terminal O1 and the third terminal I. Likewise, the variable capacitance elements C2a to C2c are connected in parallel with respect to direct current between the second terminal O2 and the third terminal I so that the bias voltages can be applied separately to the respective variable capacitance elements. The voltages applied to the variable capacitance elements C1a to C2c cause the dielectric constants of the variable capacitance elements C1a to C2c to vary to levels according to the voltages, with the result that desired capacitance values can be obtained.

That is to say, the bias voltages for controlling the capacitances of the variable capacitance elements C1a to c2c to desired levels can be stably supplied to the respective variable capacitance elements C1a to C2c separately so that the dielectric constants of the dielectric layers 4 of the variable capacitance elements C1a to C2c can vary as desired by application of the bias voltage, thereby making it easy to control the capacitance value.

As described above, the variable capacitor array can be reduced in size and designed to be handled easily by providing the first terminal O1, the second terminal O2, and the third terminal I with the functions of the first and second bias terminals V1 and V2.

In the first variable capacitor C1, the group of first separate bias lines B11 and B12 are respectively connected to a connection point of the solder terminal portion 111 serving as a part of the third terminal I and the variable capacitance element C1a and a connection point of the variable capacitance element C1b and the variable capacitance element C1c, and constituted by a conductor line 31 and a thin-film resistor 61. To be specific, the conductor line 31 is connected to the extraction electrode layer 8 by way of the thin-film resistor 61 serving as the resistor component R1 and then connected to the upper electrode layers 5 of the variable capacitance elements C1a, C1b, and C1c, and the solder terminal portion 111 by way of the extraction electrode B. Likewise, the groups of second separate bias lines B21 and B22 are respectively connected to a connection point of the variable capacitance element C1a and the variable capacitance element C1b and a connection point of the variable capacitance element C1c and the solder terminal portion 112a, and constituted by a conductor line 32 and a thin-film resistor 62. To be specific, the conductor line 32 is connected to the lower electrode layers 2 of the variable capacitance elements C1a, C1b, and C1c and the solder terminal portion 112a by way of the thin-film resistor 62 serving as the resistor component R2. Likewise, the groups of first and second separate bias lines are connected also to the second variable capacitor C2.

These conductor lines 31 and 32 can be formed by additional deposition after the above-described lower electrode layers 2, dielectric layers 4, and upper electrode layers 5 have been formed. At this time, it is desirable to employ the liftoff process in order to protect the lower electrode layers 2, dielectric layers 4, and upper electrode layer 5 which have been already formed. To be specific, a photoresist is applied by the spin coat method onto the supporting substrate 1 on which the lower electrode layer 2 etc. have been formed, and a predetermined pattern is formed with the photoresist by the photolithography process and this is used as a mask on which conductive layers to be the conductor lines 31 and 32 are then deposited, followed by removal of the photoresist in the liftoff process two obtain a pattern of desired form, thus forming the conductor lines 31 and 32.

Further, these conductor lines 31 and 32 may be formed by carrying out the patterning of these conductor lines 31 and 32 simultaneously with the patterning of the lower electrode layer 2.

For a material of the conductor lines 31 and 32, it is desirable to use Au which has low resistance, in order to reduce variation of resistance values of the groups of first and second separate bias lines B11, B12, B21, and B22, and in the case where the thin-film resistors 61 and 62 have sufficiently high resistance, Pt or the like substance may be used so as to form the conductor lines with the same material in the same process as the lower electrode layer 2.

Next, the thin-film resistors 61 and 62 constituting the groups of first and second separate bias lines B11, B12, B21, and B22 are formed of a material having high resistance. To be specific, in order to produce the small thin-film resistors 61 and 62 having desired resistance, its specific resistance is desirably 1 mΩ·cm or more. The material of such thin-film resistors 61 and 62 having high resistance includes, specifically, tantalum nitride and tantalum oxide containing tantalum (Ta) and an ingredient containing Si in addition to those just stated.

In the case where the specific resistance $\rho$ determined by $R=\rho \cdot l/(w \cdot t)$ (wherein R represents resistance of the thin-film resistor; l represents a length of the thin-film resistor; w represents a width of the thin-film resistor; and t represents a film thickness of the thin-film resistor) is smaller than 1 mΩ·cm, it is necessary to decrease the film thickness t, which causes disconnection more easily. Moreover, in order to increase the resistance, the thin-film resistors 61 and 62 need to be longer so that an aspect ratio (length l/width w) becomes larger, but when the aspect ratio is too large, the variable capacitor has a large element shape. The specific resistance is therefore set at 1 mΩ·cm or more to obtain desired-level resistance without an increase in size of the element shape. On the other hand, too high specific resistance makes the temperature characteristics and reproducibility of the thin-film resistors 61 and 62 more likely to deteriorate, and accordingly the upper limit of the specific resistance is determined in view of both characteristics. For example, in the case of forming the thin-film resistors 61 and 62 each having a film thickness of 50 nm with use of the material having the specific resistance of 1 mΩ·cm or more in order to obtain the resistance value 10 kΩ of the bias line, its aspect ratio is 50 or less and with this aspect ratio, the element shape of the variable capacitor is not increased in size. For a specific material of the thin-film resistors 61 and 62, tantalum nitride (TaN), TaSiN, and TaSiO can be listed as examples. For example, in the case of tantalum nitride, the thin-film resistors 61 and 62 having desired composition ratio and resistivity can be deposited by the reactive sputtering process that sputtering is carried out with Ta as a target and in the atmosphere containing nitrogen.

By selecting appropriate conditions of such sputtering, it is possible to form the thin-film resistors 61 and 62 each having a film thickness of 50 nm or more and specific resistance of 1 mΩ·cm or more. Furthermore, after the sputtering is completed, patterning can be carried out easily by applying a resist and processing to a predetermined shape which then serves as a mask in the following etching process such as reactive ion etching (RIE).

The resistance values of the groups of first and second separate bias lines B11, B12, B21 and B22 are set so that the impedance of the groups of first and second separate bias lines B11, B12, B21 and B22 are higher than the impedance of the respective variable capacitance elements C1a to C2c in the frequency range to be used. The resistance values of the conductor lines 31 and 32 are very low compared to the resistance values of the thin-film resistors 61 and 62, with the result that the resistance values of the groups of first and second separate bias lines B11 to B22 are almost equal to the resistance values of the thin-film resistors 61 and 62. Accordingly, the resistance values of the thin-film resistors 61 and 62 are set to be higher than the impedance of the respective variable capacitance elements C1a to C2c in the frequency range to be used. For example, in the case where the variable capacitor array of the invention is used at a frequency of 1 GHz and the capacitances of the variable capacitance elements C1a to C2c are all set at 5 pF, one tenth of the above frequency, i.e., 100 MHz, serves as a reference above which no harmful influences are exerted on the impedance. That is to say, assuming that the thin-film resistors 61 and 62 are set to have resistance values more than ten times the impedance of the variable capacitance elements C1a to C2c at 100 MHz in order to prevent the signal components in the usable frequency range from leaking to the groups of first and second separate bias lines B11 to B22 and affecting the impedance of the respective variable capacitance elements C1a to C2c, the required reference values of the groups of first and second separate bias lines 311 to B22 are about 3.2 kΩ or more. Even when the resistance values of the groups of first and second separate bias lines B11 to B22 in the variable capacitor are 10 kΩ that is larger than the above values, the thin-film resistors 61 and 62 can be formed of the material having specific resistance of 1 mΩ·cm or more and each formed to have a film thickness of 50 nm and an aspect ratio of 50 or less, resulting in the thin-film resistors 61 and 62 with the aspect ratio which can be attained without an increase in size of the element shape.

It is desirable that the groups of first and second separate bias lines B11 to B22 having these thin-film resistors 61 and 62 be formed directly on the supporting substrate 1. This eliminates insulating layers which are required in forming the variable capacitance elements C1a to C2c and thus provided additionally to secure the insulation among the lower electrode layer 2, the upper electrode layer 5, and the extraction electrode layer 8, and it is thus possible to decrease the number of layers constituting the variable capacitance elements C1a to C2c. Furthermore, the use of the thin-film resistors 61 and 62 having high resistance allows the variable capacitor array to be produced without an increase in size.

And the insulating layer 7 is provided with a through hole which is located in the insulating layer 7 on the conductor line 31 and extends to the conductor line 31 so that a part of the conductor line 31 is exposed in order to secure the connection between the thin-film resistor 61 and the extraction electrode layer 8.

The variable capacitor array shown in FIG. 7 can be produced by the above configuration.

In the variable capacitor array described above, the group of first separate bias lines and the group of second separate bias lines are connected between the first terminal or second terminal and the third terminal, with the result that a plurality of the variable capacitance elements with dielectric constants which are varied by application of voltages are connected in parallel with respect to direct current and in series with respect to high frequency, and because the variable capacitance element group includes the plurality of the variable capacitance elements connected in parallel with respect to direct current, a predetermined bias voltage can be applied to each of the variable capacitance elements, thereby allowing for the best use of the tunability of each of the variable capacitance elements depending on the bias voltage.

Note that in the example shown in FIG. 7, two variable capacitance elements share the lower electrode layer 2 so that a plurality of the variable capacitance elements are connected in series in a simple configuration. By employing such a configuration, the polarity of the bias voltages (direct-current voltage) applied to the upper electrode layers 5 in the plurality of the variable capacitance elements can be the same. In this case, it is preferable that a low potential of the bias voltage be applied to the upper electrode layer 5 and that the dielectric layer 4 be made of a material containing oxygen while the upper electrode layer 5 be made of a conductive oxide material having oxidizing ability to the material of the dielectric layer 4. To be specific, in order to have the low potential of the bias voltage be applied to the upper electrode layer 5, the solder terminal 111 is connected on a low potential side of the bias voltage while the solder terminals 112a and 112b are connected on a high potential side of the bias voltage. Further, as to the materials of the dielectric layer 4 and the upper electrode layer 5, the dielectric layer 4 may be made of perovskite crystalline oxide containing at least Ba, Sr, and Ti, and the upper electrode layer 5 may be made of iridium oxide, for example. The configuration just described can be far more reliable in the case where the bias voltage is applied. The reason why the reliability is enhanced is not clear, but the following mechanism is presumed.

Typically, in the case of continuing to apply the direct-current voltage having the same polarity to the variable capacitance element, a leak current increases with the lapse of time and ends up with the insulation breakdown of the variable capacitance element. It is commonly believed that the cause for the increase of the leak current is attributed to the fact that oxygen vacancies present in the oxide dielectric migrate toward a cathode in an electrical field of the direct-current voltage applied and accumulate in the grain boundary or the interface of the electrode and the dielectric, thereby lowering barriers on these parts and leading to the insulation breakdown at the end. Especially in the case of the variable capacitance element having a thin-film dielectric, the leak current is often suppressed by the barrier formed in the interface of the electrode and the dielectric, and when direct-current voltages continue to be applied, it is contemplated that oxygen vacancies accumulate in the interface of the cathode (negative) electrode and the dielectric, and as a result, the barrier in the interface of the electrode and the dielectric is lowered to such a height that electrons move beyond the barrier, thus leading to the increase of the leak current. Note that among a pair of the electrodes holding the dielectric therebetween, the electrode having a higher potential is an anode (positive) electrode while the electrode having a lower potential is a cathode electrode.

The oxygen vacancies in the dielectric are produced during formation of the dielectric and also result from process damage caused during production of the variable capacitance elements, and it is known that the oxygen vacancies are likely to be generated especially in the case of the perovskite crystalline oxide dielectric.

Now, the case will be discussed that a part of the upper electrode layer 5 in contact with the dielectric layer 4 is made of the conductive oxide material having oxidizing ability as described above and the upper electrode layer 5 acts as a cathode electrode (low potential). In this case, the oxygen vacancies migrate toward the upper electrode layer 5 as the direct-current voltage continues to be applied, and owing to the conductive oxide material of upper electrode layer 5 having the oxidizing ability, the oxygen vacancies thus migrated do not accumulate in the interface of the upper electrode layer 5 and the dielectric layer 4, but presumably migrate into the conductive oxide material having the oxidizing ability. As a result, the barrier in the interface of the upper electrode layer 5 and the dielectric layer 4 is considerably suppressed from being lowered, therefore leading to a suppressed increase of the leak current, which presumably enhances the reliability of the variable capacitance element.

Furthermore, the conductive oxide material is adhered to the part of the upper electrode layer 5 in contact with the dielectric layer 4, with the result that the oxygen is supplied to the dielectric layer 4 in a process of forming the conductive oxide material, which can prevent the oxygen vacancies from being generated in a process step of producing a capacitor.

Note that the above configuration which enhances the reliability is not limited to that shown in FIG. 7, and for example, the configuration corresponding to the equivalent circuit schematic of FIG. 5 exerts the same effect.

Figure 8A:
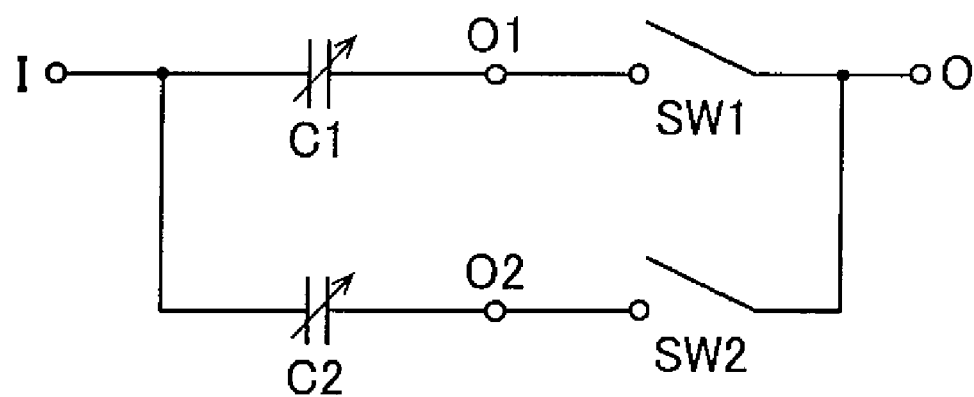
FIGS. 8A and 8B are circuit schematics each showing a variable capacitor array device according to one embodiment of the invention.
Figure 8B:
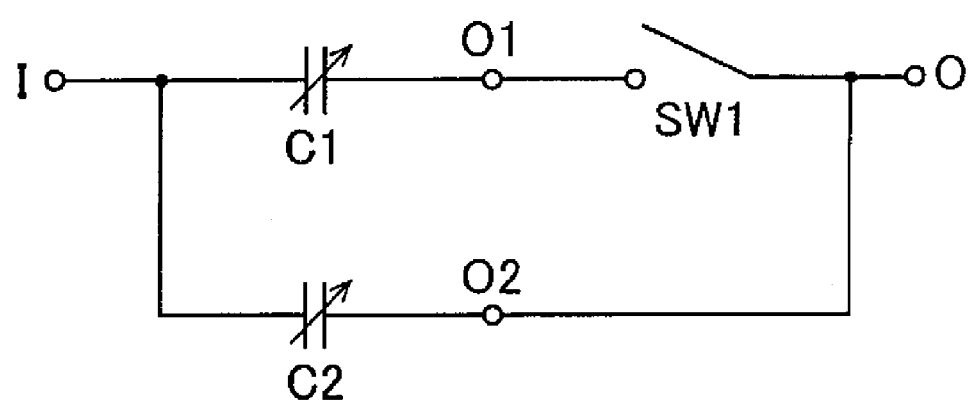

Next, the variable capacitor array device of the invention will be described. FIGS. 8A and 8B are circuit schematics each showing a variable capacitor array device according to one embodiment of the invention. In FIGS. 8A and 8B, the variable capacitor array device includes the variable capacitor array of the invention shown in FIG. 1, a switching element (SW1 and SW2 in the example shown in FIG. 8A, and SW1 in the example shown in FIG. 8B) for selecting a state by switching between at least two selection states among the three selection states, and the forth terminal O which can be connected to both of the first and second terminals by way of the switching element.

In the variable capacitor array device shown in FIG. 8A, the switching element SW1 is connected to the first terminal O1 across which the first variable capacitor C1 is connected, while the switching element SW2 is connected to the second terminal O2 across which the second variable capacitor C2 is connected, and these switching elements SW1 and SW2 are both connected to the fourth terminal O. Owing to the configuration as just described, it becomes possible to select the state by switching among the three selection states. That is to say, the switching element SW1 in the ON state and the switching element SW2 in the OFF state can bring the first selection state; the switching element SW1 in the OFF state and the switching element SW2 in the ON state can bring the second selection state; the switching elements SW1 and SW2 in the ON states can bring the third selection state.

Further, in the variable capacitor array device shown in FIG. 8B, the switching element SW1 is connected to the first terminal O1 across which the first variable capacitor C1 is connected, and the switching element SW1 and the second terminal O2 are both connected to the fourth terminal O. Owing to the configuration as just described, it becomes possible to select the state by switching between the second selection state and the third selection state. That is to say, the switching element SW1 in the OFF state can bring the second selection state while the switching element SW2 in the ON state can bring the third selection state.

Likewise, the state can be selected by switching between the first selection state and the third selection state in the configuration that the first terminal O1 is connected directly to the fourth terminal O, and the second terminal O2 is also connected to the fourth terminal O by way of the switching element SW2. That is to say, the switching element SW2 in the OFF state can bring the first selection state while the switching element SW2 in the ON state can bring the third selection state.

As described above, in the variable capacitor array device of the invention, the switching element enables selection of state by switching between at least two selection states among the three selection states of the first selection state, the second selection state, and third selection state, therefore allowing for a variable capacitor array device having high tunability.

Note that the switching element may include a high frequency relay, a coaxial switch, and an MEMS switch which are mechanical, as well as a PIN diode switch and an MESFET switch which are electronic, and especially the PIN diode is preferable because it achieves a variable capacitor array device which is small and able to be driven at a low voltage and which has excellent power handling capability. Furthermore, the MEMS element is also preferable because it achieves a variable capacitor array which is small with high-level isolation and small loss.

Next, the circuit module of the invention will be described.

In the circuit module of the invention, the variable capacitor array device as described above is used as a capacitor which constitutes a resonant circuit, a phase shifting circuit, a matching circuit, an attenuation circuit, or the like and which has the third terminal I and the fourth terminal O as input and output terminals, and because the variable capacitor array device having high tunability is used, the circuit module of the invention is able to be used in wide ranges of frequency, power, and temperature.

Figure 9:
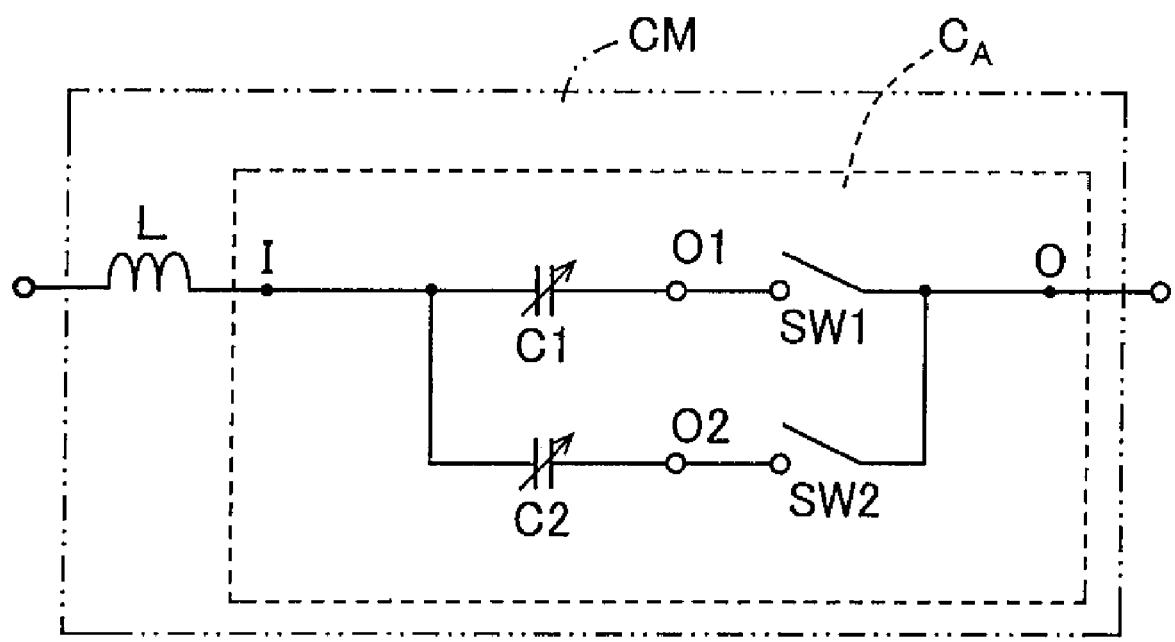
FIG. 9 is an equivalent circuit schematic showing a circuit module according to one embodiment of the invention.

FIG. 9 shows an equivalent circuit schematic of a variable resonant circuit as one example of the circuit module CM having the variable capacitor array device. In FIG. 9, a symbol L denotes an inductor which serves as an impedance element having an inductor component, and $C_A$ denotes a variable capacitor array device. Note that in FIG. 9, a bias supply circuit, a direct-current-limiting capacitance element, and the like component are omitted.

In the equivalent circuit schematic of FIG. 9, the resonant frequency f1 is determined by $f1=1/(2\pi(L1 \cdot C_A 1)^{1/2})$ wherein $C_A 1$ represents the initial value of the variable capacitor array device $C_A$, and L1 represents a value of the inductor L. Further, a voltage is applied so that the capacitance value of the variable capacitor array device $C_A$ is adjusted to $C_A 2$, and the resonant frequency f2 is then determined by $f2=1/(2\pi(L1 \cdot C_A 2)^{1/2})$. In other words, the resonant frequency of the variable resonant circuit can vary only by the voltage application which adjusts the capacitance values of the variable capacitors C1 and C2. Especially in the case where the capacitances of the variable capacitors C1 and C2 constituting the variable capacitor array satisfy the above-stated expressions (1)-(2) or (3)-(4) or (5)-(7), the resonant frequency can be changed continuously in the wide frequency range.

Although one example is given herein of the variable capacitance circuit of the invention, the configuration of the variable resonant circuit may be modified to, for example, an LC parallel structure or multistage structure, depending on an object, without departing from the scope of the invention. Further, a transmission line or a λ/4 resonator may be used as the impedance element having the inductor component.

Note that the invention is not limited to examples of the above-described embodiments, and various modifications may as well be added without departing from the scope of the invention. For example, the explanations were made as to the example that, in the variable capacitor arrays shown in FIG. 3, FIG. 4, and FIGS. 5 to 7, the first and second variable capacitors C1 and C2 are in form of the variable capacitance element groups having the same number of variable capacitance elements connected in series, but the number of variable capacitance elements connected in series may be different from one group to another. In addition, the first and second variable capacitors C1 and C2 may have a plurality of variable capacitance elements connected in parallel or may include both of a series-connected section and a parallel-connected section.

The invention may be embodied in other various forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A variable capacitor array comprising:
   a first variable capacitor comprising a first dielectric layer having a first dielectric constant which is varied by application of a voltage, and a pair of electrodes holding the first dielectric layer therebetween;
   a second variable capacitor comprising a second dielectric layer having a second dielectric constant which is varied by application of a voltage, and a pair of electrodes holding the second dielectric layer therebetween;
   a first terminal connected to one electrode of the pair of electrodes of the first variable capacitor;
   a second terminal connected to one electrode of the pair of electrodes of the second variable capacitor; and
   a third terminal connected to both of another electrode of the pair of electrodes of the first variable capacitor and another electrode of the pair of electrodes of the second variable capacitor,
   wherein a selection state can be selected by switching between at least two selection states among three selection states of a first selection state that the first terminal and the third terminal are selected, a second selection state that the second terminal and the third terminal are selected, and a third selection state that the first selection state and the second selection state are selected simultaneously,
   wherein a variable capacitance range in the first selection state and a variable capacitance range in the second selection state partially overlap with each other and/or the variable capacitance range in the first selection state and a variable capacitance range in the third selection state partially overlap with each other, the variable capacitance range in the second selection state and the variable capacitance range in the third selection state being separated from each other.

2. The variable capacitor array of claim 1, wherein capacitance values of the first variable capacitor and the second variable capacitor satisfy all the following expressions (1) and (2):

$$C1(0) \geq C2(0) \tag{1}$$

$$C1(0) \geq C1(V) + C2(V) \tag{2}$$

where $C1(0)$ and $C1(V)$ respectively represent capacitances of the first variable capacitor before and after voltage application, and $C2(0)$ and $C2(V)$ respectively represent capacitances of the second variable capacitor before and after voltage application.

3. The variable capacitor array of claim 1, wherein capacitance values of the first variable capacitor and the second variable capacitor satisfy all the following expressions (3) and (4):

$$C1(0) \geq C2(0) \tag{3}$$

$$C2(0) \geq C1(V) \tag{4}$$

where $C1(0)$ and $C1(V)$ respectively represent capacitances of the first variable capacitor before and after voltage application, and $C2(0)$ and $C2(V)$ respectively represent capacitances of the second variable capacitor before and after voltage application.

4. The variable capacitor array of claim 1, wherein capacitance values of the first variable capacitor and the second variable capacitor satisfy all the following expressions (5) to (7):

$$C1(0) \geq C2(0) \tag{5}$$

$$C1(0) \geq C1(V) + C2(V) \tag{6}$$

$$C2(0) \geq C1(V) \tag{7}$$

where $C1(0)$ and $C1(V)$ respectively represent capacitances of the first variable capacitor before and after voltage application, and $C2(0)$ and $C2(V)$ respectively represent capacitances of the second variable capacitor before and after voltage application.

5. The variable capacitor array of claim 1, wherein at least one of the first and second variable capacitors comprises a variable capacitance element group including N pieces (where N is a natural number) of variable capacitance elements connected in series, and a group of first separate bias lines and a group of second separate bias lines which are alternately connected to both ends of the variable capacitance element group and between adjacent pieces of the variable capacitance elements, in one array direction of the variable capacitance elements.

6. The variable capacitor array of claim 5, further comprising:
   a first bias terminal to which the group of first separate bias lines is connected in common; and
   a second bias terminal to which the group of second separate bias lines is connected in common.

7. The variable capacitor array of claim 5, wherein the variable capacitance element group comprises an odd number of the variable capacitance elements connected to each other, and the group of first separate bias lines is connected in common and the group of second separate bias lines is connected in common.

8. A variable capacitor array device comprising:
   the variable capacitor array of claim 7;
   a switching element for selecting a state by switching between at least two selection states among the three selection states; and
   a fourth terminal to which at least one of the first and second terminals are connected in common by way of the switching element.

9. The variable capacitor array device of claim 8, wherein the switching element is a PIN diode.

10. The variable capacitor array device of claim 8, wherein the switching element comprises a MEMS element.

11. A circuit module comprising:
    the variable capacitor array device of claim 10, wherein the third terminal and the fourth terminal serve as input and output terminals.

12. The variable capacitor array of claim 1,
wherein a capacitance in the selection state, which is selected by switching between the first selection state and the second selection state, continuously changes,
wherein a capacitance in the selection state, which is selected by switching between the first selection state and the third selection state, continuously changes.

13. The variable capacitor array of claim 1, wherein a lower limit of the variable capacitance range in the first selection state is equal to an upper limit of the variable capacitance range in the second selection state and/or an upper limit of the variable capacitance range in the first selection state is equal to a lower limit of the variable capacitance range in the third selection state.

14. The variable capacitor array of claim 1, wherein the capacitance continuously changes by switching a voltage applied state or not applied state which is based on switching between the two selection states.

* * * * *